(12) United States Patent
Aoki et al.

(10) Patent No.: US 9,793,914 B2
(45) Date of Patent: Oct. 17, 2017

(54) ANALOG-TO-DIGITAL CONVERTER, ELECTRONIC DEVICE, AND METHOD OF CONTROLLING ANALOG-TO-DIGITAL CONVERTER

(71) Applicant: SONY SEMICONDUCTOR SOLUTIONS CORPORATION, Kanagawa (JP)

(72) Inventors: Hiroshi Aoki, Kanagawa (JP); Ryuujirou Abe, Kanagawa (JP); Satoshi Fukuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/500,547

(22) PCT Filed: Jun. 16, 2015

(86) PCT No.: PCT/JP2015/067297
§ 371 (c)(1),
(2) Date: Jan. 31, 2017

(87) PCT Pub. No.: WO2016/024439
PCT Pub. Date: Feb. 18, 2016

(65) Prior Publication Data
US 2017/0222655 A1  Aug. 3, 2017

(30) Foreign Application Priority Data

Aug. 12, 2014  (JP) ................................ 2014-164568

(51) Int. Cl.
*H03M 1/06*  (2006.01)
*H03M 1/12*  (2006.01)
(Continued)

(52) U.S. Cl.
CPC .......... *H03M 1/1245* (2013.01); *H03K 5/159* (2013.01); *H03K 5/1534* (2013.01)

(58) Field of Classification Search
CPC .... H03M 1/1245; H03M 1/06; H03M 1/1023; H03M 1/203; H03M 1/207; H03M 1/12; H03K 5/1534; H03K 5/159
(Continued)

(56) References Cited

U.S. PATENT DOCUMENTS 3,714,375 A * 1/1973 Stover ................. H04W 88/188
370/204
6,498,617 B1 * 12/2002 Ishida ................. G06K 15/1209
347/240

(Continued)

OTHER PUBLICATIONS

Park, e al., "A 78 dB SNDR 87 mW 20 MHz Bandwidth Continuous-Time ΔΣ ADC With VCO-Based Integrator and Quantizer Implemented in 0.13 μm CMOS",IEEE Journal of Solid-State Circuits, vol. 44, No. 12, Dec. 2009, pp. 3344-3358.

*Primary Examiner* — Jean B Jeanglaude
(74) *Attorney, Agent, or Firm* — Chip Law Group

(57) ABSTRACT

An analog signal is accurately converted into a digital signal. An oscillator generates an oscillation signal having a cycle that depends on a signal level of an input analog signal. A current bit generation unit generates, as a current bit, a bit indicating a value of the oscillation signal at each of a plurality of timings within the cycle. A delay unit delays each current bit over a predetermined period and supplies the delayed current bit as a delayed bit. A determination unit determines whether a change amount of a phase of the oscillation signal changed within the predetermined period is greater than a half cycle of the cycle. An output unit generates and outputs data indicating a period in which respective values of the current bit and the delayed bit form a specific combination when the change amount is not greater than the half cycle, and generates and outputs data indicating a period in which the respective values of the current bit and the delayed bit are the same or form the specific combination when the change amount is greater than the half cycle.

11 Claims, 25 Drawing Sheets

(51) Int. Cl.
*H03K 5/159* (2006.01)
*H03K 5/1534* (2006.01)

(58) Field of Classification Search
USPC .......................................... 341/163, 155, 118
See application file for complete search history.

(56) References Cited

U.S. PATENT DOCUMENTS

| | | | | |
|---|---|---|---|---|
| 6,804,074 | B2* | 10/2004 | Shoji | ......................... H03L 7/14 |
| | | | | 327/156 |
| 7,177,610 | B2* | 2/2007 | Scott | .................... H04B 1/0003 |
| | | | | 323/315 |
| 7,528,760 | B2* | 5/2009 | Forejt | ................... G04F 10/005 |
| | | | | 341/155 |
| 7,915,935 | B1* | 3/2011 | Menon | ...................... H03L 7/18 |
| | | | | 327/159 |
| 8,063,810 | B2 | 11/2011 | Guenther | |
| 2002/0017934 | A1* | 2/2002 | Shoji | ....................... H03L 7/091 |
| | | | | 327/156 |
| 2005/0219108 | A1* | 10/2005 | Piasecki | ................ H03M 1/124 |
| | | | | 341/163 |
| 2012/0112936 | A1 | 5/2012 | Huang | |
| 2012/0154192 | A1 | 6/2012 | Op 'T Eynde | |
| 2012/0194369 | A1 | 8/2012 | Galton et al. | |

\* cited by examiner

FIG. 5

| VOLTAGE CONTROL CLOCK SIGNAL | Q | Qn |
|---|---|---|
| VCOi > XVCOi | 1 | 0 |
| VCOi ≤ XVCOi | 0 | 1 |

FIG. 6

| D | Dn | LATCH OUTPUT : Q |
|---|---|---|
| 0 | 0 | HOLD |
| 0 | 1 | 0 |
| 1 | 0 | 1 |

FIG. 7

| D | SCLK | D-FF OUTPUT : Q | D-FF OUTPUT : Qn |
|---|---|---|---|
| 1 | ↑ | 1 | 0 |
| 0 | ↑ | 0 | 1 |
| 1/0 | OTHER THAN ↑ | HOLD | HOLD |

FIG. 11

| AND [0] ~ AND [9] | DETERMINATION RESULT |
|---|---|
| ALL 0 | 0<br>( PHASE CHANGE AMOUNT<br>> 180 DEGREES ) |
| ANY IS 1 | 1<br>( PHASE CHANGE AMOUNT<br>≤ 180 DEGREES ) |

FIG. 13

| DETERMINATION RESULT | DELAYED BIT Del [j] | CURRENT BIT Cur [j] | ARITHMETIC RESULT Ph [j] |
|---|---|---|---|
| 0 (PHASE CHANGE AMOUNT > 180 DEGREES) | 0 | 0 | 1 |
| | 0 | 1 | 1 |
| | 1 | 0 | 0 |
| | 1 | 1 | 1 |
| 1 (PHASE CHANGE AMOUNT ≤ 180 DEGREES) | 0 | 0 | 0 |
| | 0 | 1 | 1 |
| | 1 | 0 | 0 |
| | 1 | 1 | 0 |

PERIOD OF 0 → 1 = PHASE CHANGE AMOUNT
(108 DEGREES)

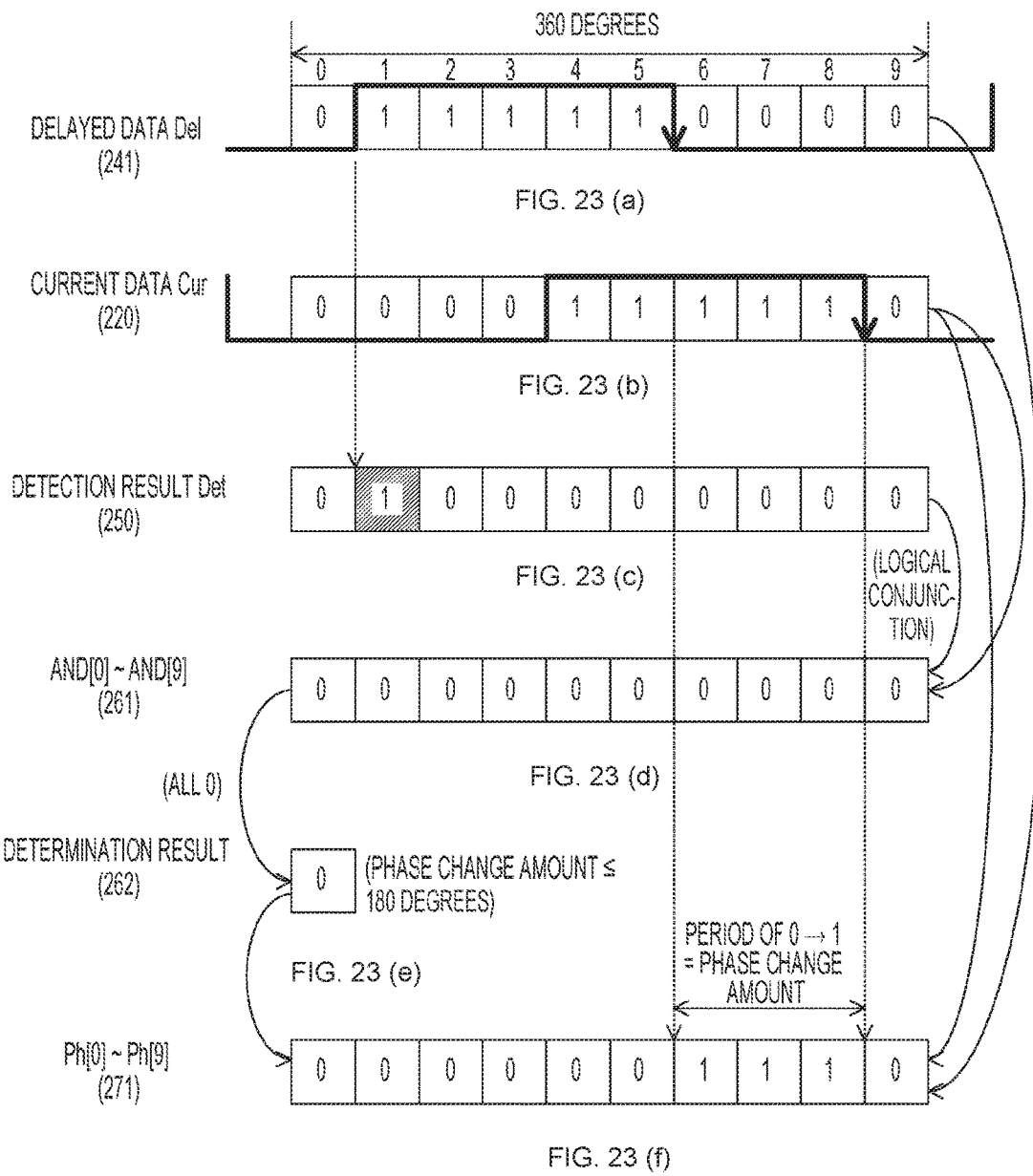

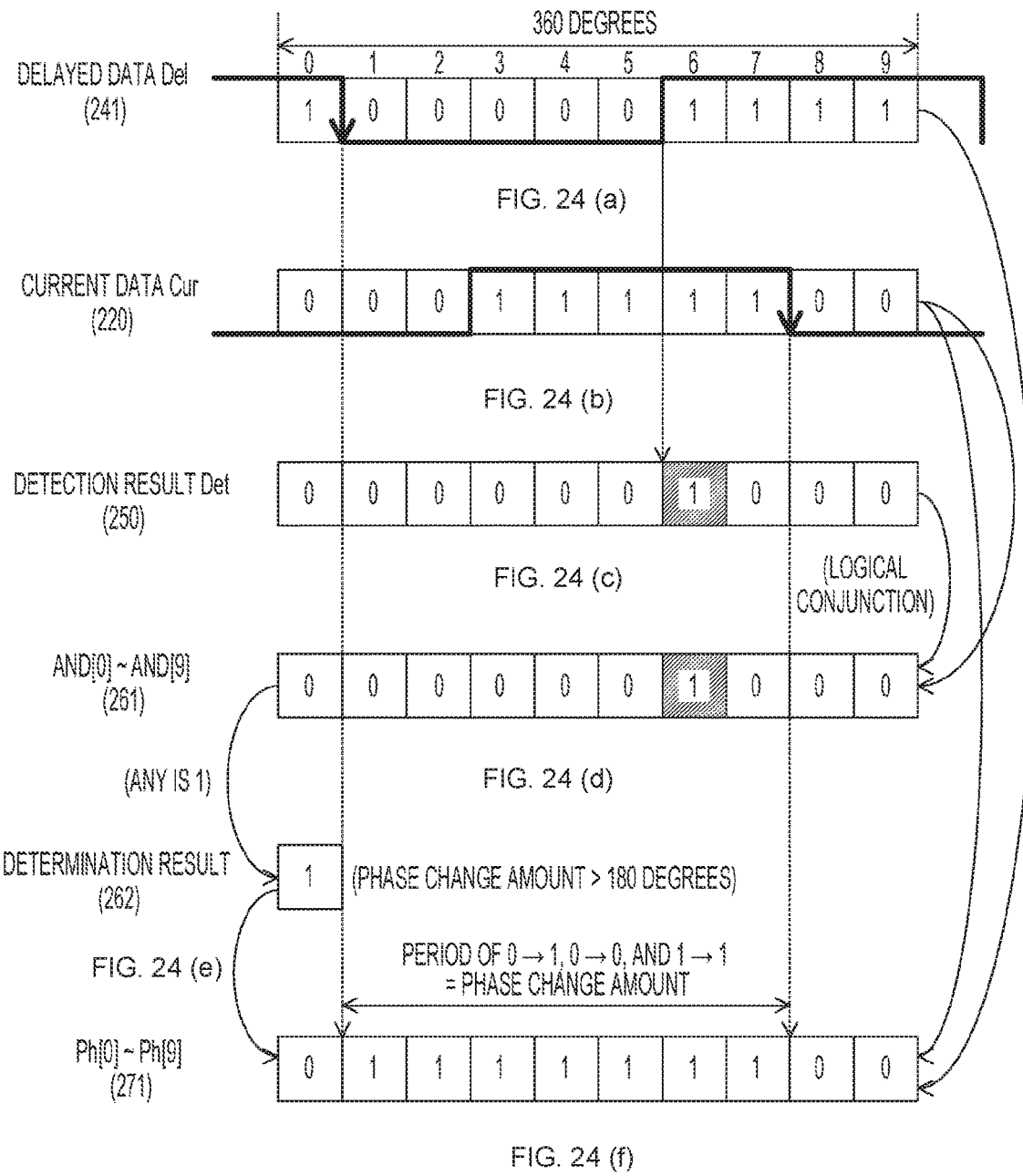

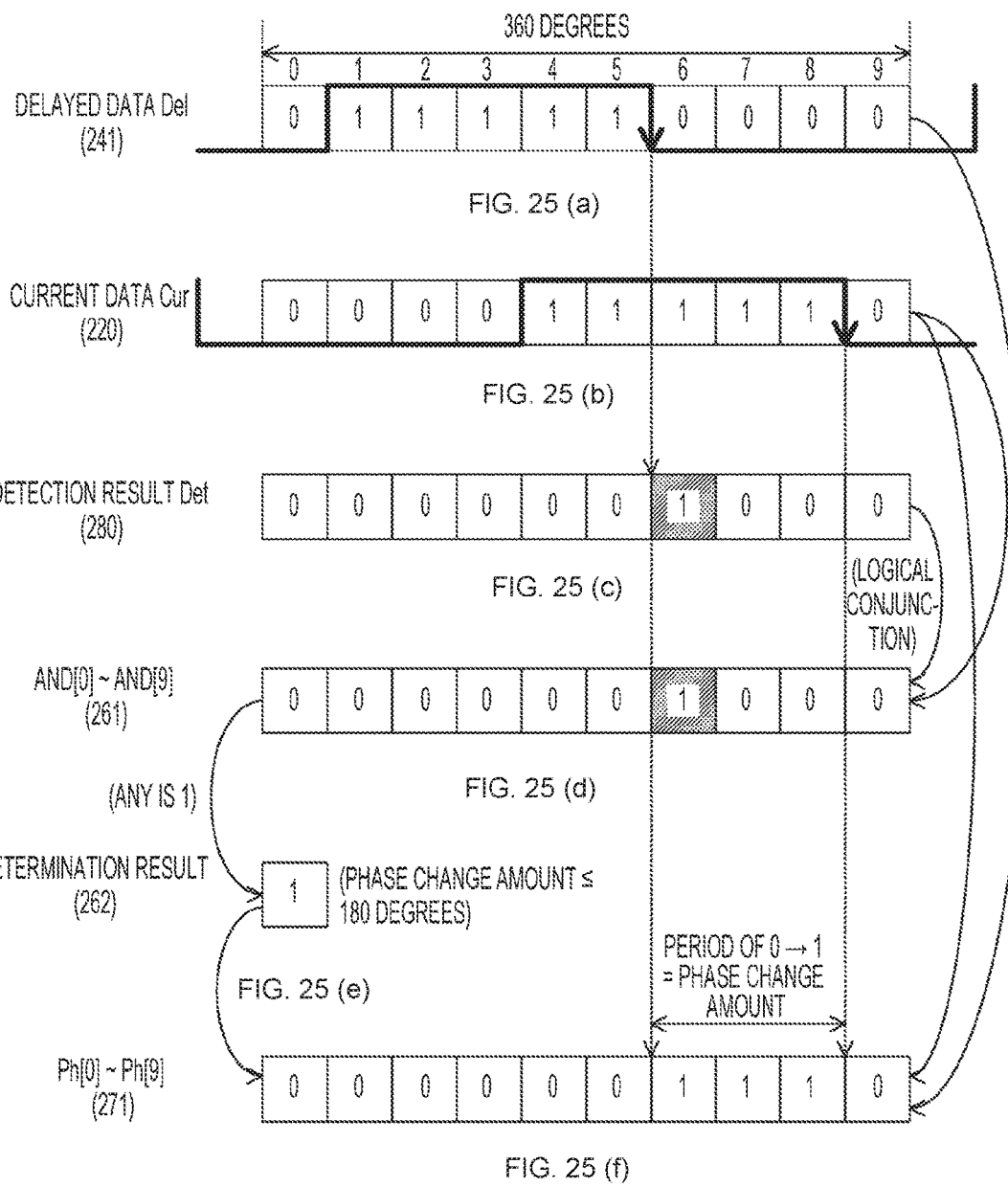

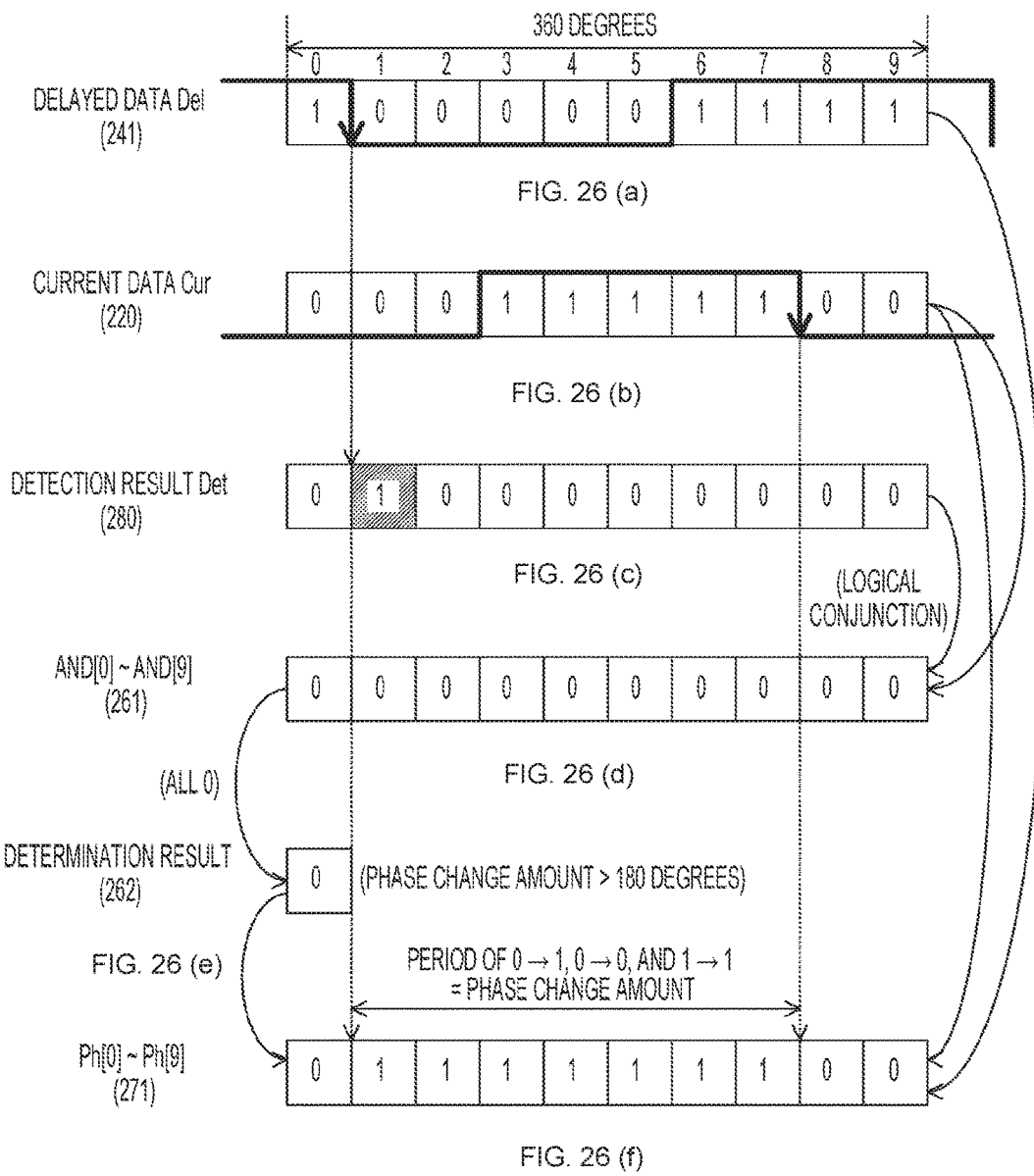

ANALOG-TO-DIGITAL CONVERTER, ELECTRONIC DEVICE, AND METHOD OF CONTROLLING ANALOG-TO-DIGITAL CONVERTER

CROSS REFERENCE TO RELATED APPLICATIONS

This application is a U.S. National Phase of International Patent Application No. PCT/JP2015/067297 filed on Jun. 16, 2015, which claims priority benefit of Japanese Patent Application No. JP 2014-164568 filed in the Japan Patent Office on Aug. 12, 2014. Each of the above-referenced applications is hereby incorporated herein by reference in its entirety.

TECHNICAL FIELD

The present technology relates to an analog-to-digital converter, an electronic device, and a method of controlling the analog-to-digital converter. Specifically, the present technology relates to the analog-to-digital converter provided with an oscillator, the electronic device, and the method of controlling the analog-to-digital converter.

BACKGROUND ART

Conventionally, when an analog signal is processed in a digital circuit, an analog-to-digital (AD) converter for converting the analog signal into a digital signal is provided at a preceding stage of the digital circuit. For example, an AD converter provided with an oscillator that generates an oscillation signal having a frequency that depends on a signal level of an analog signal, n (n is an integer of two or more) flip-flops, and a logic circuit has been proposed (for example, refer to Non-Patent Document 1).

In the AD converter, the n flip-flops hold values of the oscillation signal at respective timings obtained by dividing an oscillation cycle of the oscillation signal into n, and supply data indicating these values to the logic circuit. Then, the logic circuit delays the data over a period of one cycle of a sampling clock, compares the data before the delay and the data after the delay on a bit basis to count the number of bits changed from "0" to "1", and outputs a digital signal of the count value. If a change amount of a phase of the oscillation signal within the sampling period is equal to or less than a half cycle of the oscillation cycle, the count value depends on the change amount of the phase. Therefore, the digital signal has an accurate value that depends on the signal level of the analog signal.

CITATION LIST

Non-Patent Document

Non-Patent Document 1: Matthew Park, et al., A 78 dB SNDR 87 mW 20 MHz Bandwidth Continuous-Time ΔΣ ADC with VCO-Based integrator and quantizer implemented in 0.13 um CMOS, IEEE Vol. 44.

SUMMARY OF THE INVENTION

Problems to be Solved by the Invention

However, the above-mentioned conventional technology might not be able to convert the analog signal into the digital signal having the accurate value. This is because the accurate value that depends on the signal level of the analog signal cannot be obtained if the change amount of the phase exceeds the half cycle of the oscillation cycle. Therefore, it is sometimes the case that the digital signal having the accurate value is not output when the phase change amount might exceed the half cycle of the oscillation cycle, the result of which leads to a problem of a reduction in the signal-to-noise (S/N) ratio of the AD converter.

The present technology has been created in view of the above circumstances, and an object thereof is to accurately convert an analog signal into a digital signal.

Solutions to Problems

The present technology has been made in order to solve the above-mentioned problem. A first aspect of the present technology is an analog-to-digital converter and a method of controlling the same, and the analog-to-digital converter includes: an oscillator that generates an oscillation signal having a cycle that depends on a signal level of an input analog signal; a current bit generation unit that generates, as a current bit, a bit indicating a value of the oscillation signal at each of a plurality of timings within the cycle; a delay unit that delays each current bit over a predetermined period and supplies the delayed current bit as a delayed bit; a determination unit that determines whether a change amount of a phase of the oscillation signal changed within the predetermined period is greater than a half cycle of the cycle; and an output unit that generates and outputs data indicating a period in which respective values of the current bit and the delayed bit form a specific combination when the change amount is not greater than the half cycle, and generates and outputs data indicating a period in which the respective values of the current bit and the delayed bit are the same or form the specific combination when the change amount is greater than the half cycle. This provides a function of outputting the data indicating the period in which the respective values of the current bit and the delayed bit are the same or form the specific combination when the change amount of the phase of the oscillation signal changed within the predetermined period is greater than the half cycle.

In addition, the first aspect may further include an edge detection unit that detects presence or absence of one of a rising edge and a falling edge of the oscillation signal at each of the plurality of timings on the basis of either the current bit or the delayed bit, and the determination unit may detect whether the change amount is great as compared with the half cycle in accordance with whether the respective values of the current bit and the delayed bit corresponding to the timing at which the presence of one of the edges is detected are the same. This provides a function of detecting whether the phase change amount is great as compared with the half cycle in accordance with whether the respective values of the current bit and the delayed bit corresponding to the timing at which the presence of the edge is detected are the same.

In addition, according to the first aspect, the edge detection unit may detect the presence or absence of one of the edges on the basis of the delayed bit. This provides a function of detecting the presence or absence of one of the edges on the basis of the delayed bit.

In addition, according to the first aspect, the edge detection unit may detect the presence or absence of the rising edge on the basis of the delayed bit, and the determination unit may determine that the change amount is not greater than the half cycle when the current bit corresponding to the timing at which the presence of the rising edge is detected is at a low level, and may determine that the change amount is greater than the half cycle when the current bit is at a high level. This provides a function of determining that the change amount is not greater than the half cycle when the current bit corresponding to the timing at which the presence of the rising edge is detected is at the low level.

In addition, according to the first aspect, the edge detection unit may detect the presence or absence of the falling edge on the basis of the delayed bit, and the determination unit may determine that the change amount is not greater than the half cycle when the current bit corresponding to the timing at which the presence of the falling edge is detected is at a high level, and may determine that the change amount is greater than the half cycle when the current bit is at a low level. This provides a function of determining that the change amount is not greater than the half cycle when the current bit corresponding to the timing at which the presence of the falling edge is detected is at the high level.

In addition, according to the first aspect, the edge detection unit may detect the presence or absence of one of the edges on the basis of the current bit. This provides a function of detecting the presence or absence of one of the edges on the basis of the current bit.

In addition, according to the first aspect, the edge detection unit may detect the presence or absence of the rising edge on the basis of the current bit, and the determination unit may determine that the change amount is not greater than the half cycle when the delayed bit corresponding to the timing at which the presence of the rising edge is detected is at a high level, and may determine that the change amount is greater than the half cycle when the delayed bit is at a low level. This provides a function of determining that the change amount is not greater than the half cycle when the delayed bit corresponding to the timing at which the presence of the rising edge is detected is at the high level.

In addition, according to the first aspect, the edge detection unit may detect the presence or absence of the falling edge on the basis of the current bit, and the determination unit may determine that the change amount is not greater than the half cycle when the delayed bit corresponding to the timing at which the presence of the falling edge is detected is at a low level, and may determine that the change amount is greater than the half cycle when the delayed bit is at a high level. This provides a function of determining that the change amount is not greater than the half cycle when the delayed bit corresponding to the timing at which the presence of the rising edge is detected is at the low level.

In addition, according to the first aspect, the output unit may count the number of the timings at which the specific combination is formed and generate data of a count value as the data indicating the period when the change amount is not greater than the half cycle, and may count the number of the timings at which the respective values of the current bit and the delayed bit are the same or form the specific combination and generate data of a count value as the data indicating the period when the change amount is greater than the half cycle. This provides a function of counting the number of timings at which the respective values of the current bit and the delayed bit are the same or form the specific combination when the change amount is greater than the half cycle.

Moreover, a second aspect of the present technology is an electronic device including: an oscillator that generates an oscillation signal having a cycle that depends on a signal level of an input analog signal; a current bit generation unit that generates, as a current bit, a bit indicating a value of the oscillation signal at each of a plurality of timings within the cycle; a delay unit that delays each current bit over a predetermined period and supplies the delayed current bit as a delayed bit; a determination unit that determines whether a change amount of a phase of the oscillation signal changed within the predetermined period is greater than a half cycle of the cycle; an output unit that generates and outputs data indicating a period in which respective values of the current bit and the delayed bit form a specific combination when the change amount is not greater than the half cycle, and generates and outputs data indicating a period in which the respective values of the current bit and the delayed bit are the same or form the specific combination when the change amount is greater than the half cycle; and a processing unit that processes the data. This provides a function of outputting the data indicating the period in which the respective values of the current bit and the delayed bit are the same or form the specific combination when the change amount of the phase of the oscillation signal changed within the predetermined period is greater than the half cycle.

Effects of the Invention

According to the present technology, an excellent effect of being capable of accurately converting an analog signal into a digital signal can be achieved. Note that the effects described herein are not necessarily limited, and any of effects described in the present disclosure may be obtained.

BRIEF DESCRIPTION OF DRAWINGS

FIG. 5 is a table illustrating an example of operation of a comparator according to the embodiment.

FIG. 6 is a table illustrating an example of operation of a latch circuit according to the embodiment.

FIG. 7 is a truth table illustrating an example of operation of a flip-flop according to the embodiment.

FIG. 11 is a table illustrating an example of operation of a determination result generation unit according to the embodiment.

FIG. 13 is a table illustrating an example of operation of an arithmetic circuit according to the embodiment.

FIGS. 23(a) to 23(f) are diagrams for explaining an arithmetic method that is applied when the phase change amount is equal to or less than 180 degrees according to the second modification of the embodiment.

FIGS. 24(a) to 24(f) are diagrams for explaining an arithmetic method that is applied when the phase change amount exceeds 180 degrees according to the second modification of the embodiment.

FIGS. 25(a) to 25(f) are diagrams for explaining an arithmetic method that is applied when the phase change amount is equal to or less than 180 degrees according to a third modification of the embodiment.

FIGS. 26(a) to 26(f) are diagrams for explaining an arithmetic method that is applied when the phase change amount exceeds 180 degrees according to the third modification of the embodiment.

MODE FOR CARRYING OUT THE INVENTION

Hereinafter, a mode for carrying out the present technology (hereinafter referred to as an embodiment) will be described. The description will proceed in the following order.

1. First Embodiment (example of performing AD conversion after determining whether a phase change amount is equal to or less than a half cycle)
2. First Modification
3. Second Modification
4. Third Modification 1. First Embodiment

[Configuration Example of Electronic Device]

Figure 1:
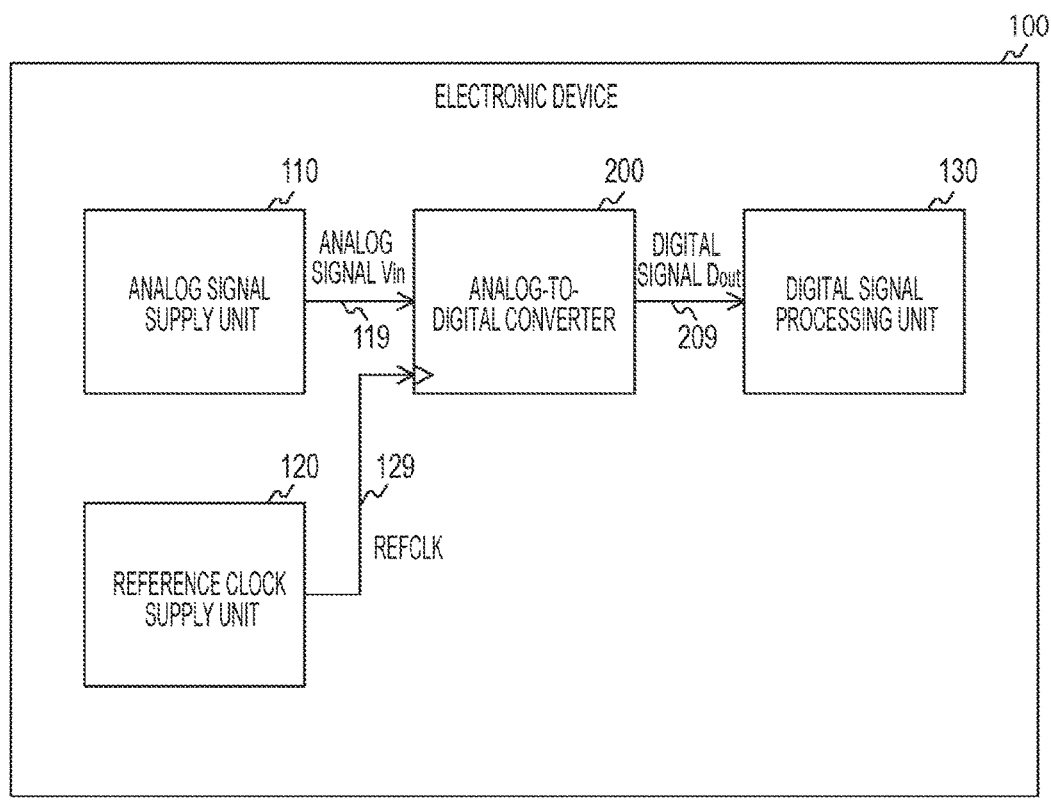
FIG. 1 is a block diagram illustrating a configuration example of an electronic device according to an embodiment.

FIG. 1 is a block diagram illustrating a configuration example of an electronic device 100 according to an embodiment of the present technology. The electronic device 100 is a device for converting an analog signal into a digital signal and processing the digital signal, and includes an analog signal supply unit 110, a reference clock supply unit 120, an analog-to-digital converter 200, and a digital signal processing unit 130. As the electronic device 100, for example, an imaging device, a wireless communication device, a measuring device, and an information processing device or the like are assumed.

Note that although the analog-to-digital converter 200 is herein configured to be provided in a device such as the electronic device 100, the analog-to-digital converter 200 may be provided in a module or an instrument such as an image sensor or a measuring instrument.

The analog signal supply unit 110 generates an analog voltage signal as an analog signal $V_{in}$, and supplies the analog signal $V_{in}$ to the analog-to-digital converter 200 via a signal line 119. For example, an audio signal or an image signal is generated as the analog signal $V_{in}$. Note that the analog signal supply unit may generate an analog current signal. The analog signal supply unit 110 may also receive an analog signal from the outside and supply the analog signal to the analog-to-digital converter 200.

The reference clock supply unit 120 generates a reference clock signal REFCLK having a predetermined frequency as a clock signal to be referred to, and supplies the reference clock signal REFCLK to the analog-to-digital converter 200 via a signal line 129.

The analog-to-digital converter 200 converts the analog signal $V_{in}$ into a digital signal $D_{out}$ in synchronization with the reference clock signal REFCLK. The analog-to-digital converter 200 supplies the converted digital signal $D_{out}$ to the digital signal processing unit 130 via a signal line 209.

The digital signal processing unit 130 performs a predetermined process such as an image process and an audio process on the digital signal $D_{out}$. Note that the digital signal processing unit 130 is an example of a processing unit described in the claims.

[Configuration Example of Analog-to-Digital Converter]

Figure 2:
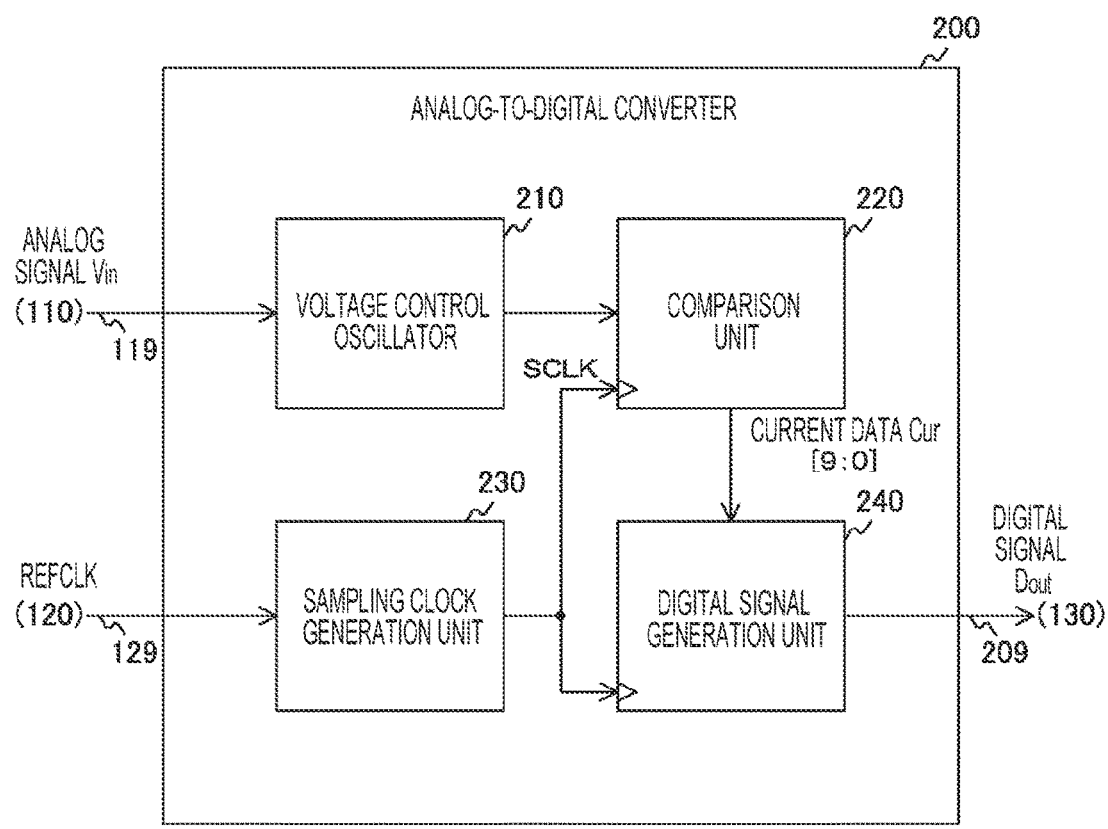
FIG. 2 is a block diagram illustrating a configuration example of an analog-to-digital converter according to the embodiment.

FIG. 2 is a block diagram illustrating a configuration example of the analog-to-digital converter 200 according to the embodiment. The analog-to-digital converter 200 includes a voltage control oscillator 210, a comparison unit 220, a sampling clock generation unit 230, and a digital signal generation unit 240.

The voltage control oscillator 210 generates a plurality of voltage control oscillation signals having a frequency that depends on a signal level of the analog signal $V_{in}$. For example, ten clock signals, i.e. VCO1 to VCO5 and XVCO1 to XVCO5, are generated as the voltage control oscillation signals. These voltage control oscillation signals are signals having the same frequency and phases different from one another. The voltage control oscillator 210 supplies these voltage control oscillation signals to the comparison unit 220. Note that the voltage control oscillator 210 is an example of an oscillator described in the claims. In addition, the voltage control oscillation signal is an example of an oscillation signal described in the claims.

Note that a current control oscillator that generates an oscillation signal having a frequency that depends on a level of the current may be provided in place of the voltage control oscillator. In this case, the current signal is input to the analog-to-digital converter 200 as the analog signal.

The sampling clock generation unit 230 generates, as a sampling clock signal SCLK, a clock signal having a higher frequency than the reference clock signal REFCLK. For example, the sampling clock signal SCLK is generated by multiplying the reference clock signal REFCLK.

The comparison unit 220 compares, in synchronization with the sampling clock signal SCLK, two voltage control oscillation signals (e.g. VCO1 and XVCO1) having phases different from each other, and generates current data Cur including a plurality of (e.g. ten) bits from a comparison result. Each of the bits in the current data Cur indicates a value of the voltage control oscillation signal at each of timings obtained by equally dividing a cycle of the voltage control oscillation signal (for example, into ten). These bits are hereinafter referred to as "current bits". The comparison unit 220 supplies the current data Cur to the digital signal generation unit 240. Note that the comparison unit 220 is an example of a current bit generation unit described in the claims.

The digital signal generation unit 240 generates the digital signal $D_{out}$ from the current data Cur in synchronization with the sampling clock signal SCLK. Details of a method of generating the digital signal $D_{out}$ will be described later.

[Configuration Example of Voltage Control Oscillator]

Figure 3:
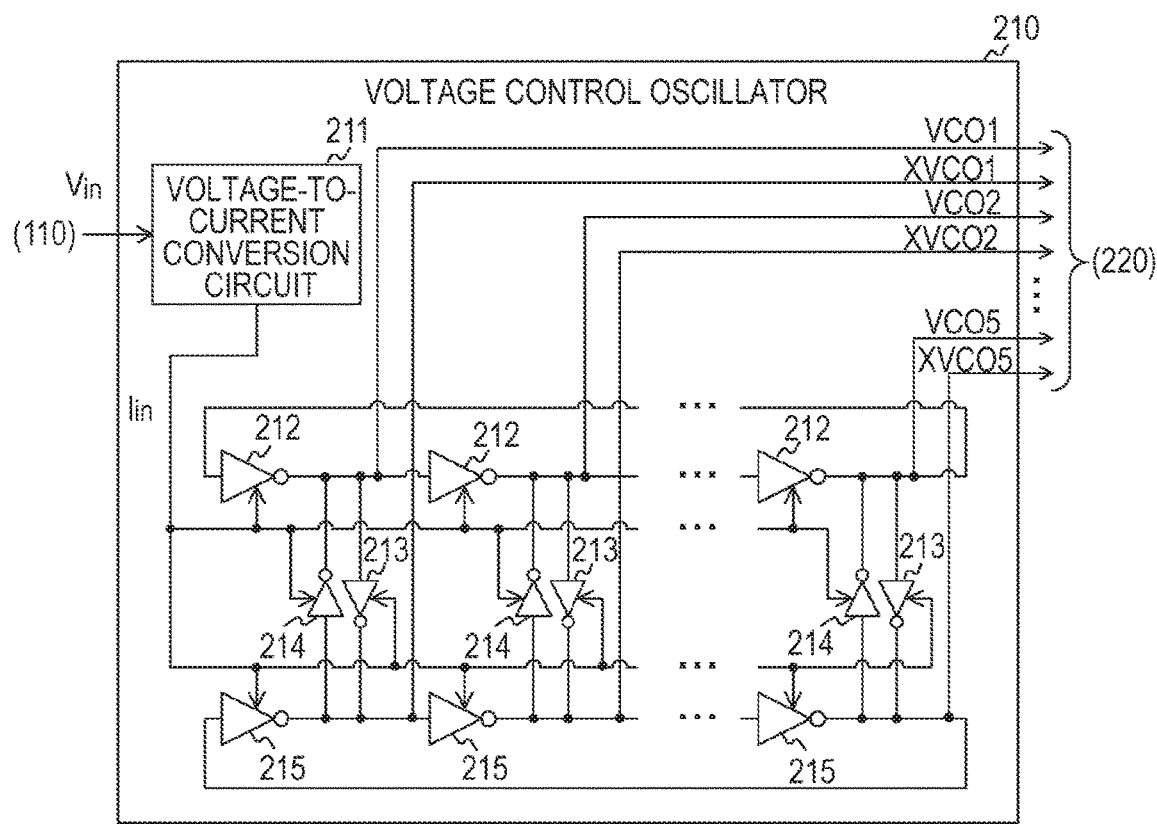
FIG. 3 is a circuit diagram illustrating a configuration example of a voltage control oscillator according to the embodiment.

FIG. 3 is a circuit diagram illustrating a configuration example of the voltage control oscillator 210 according to the embodiment. The voltage control oscillator 210 includes a voltage-to-current conversion circuit 211, an odd number of inverters 212, an odd number of inverters 213, an odd number of inverters 214, and an odd number of inverters 215. The number of respective inverters is, for example, five.

The voltage-to-current conversion circuit 211 converts the voltage of the analog signal $V_{in}$ into the current. The voltage-to-current conversion circuit 211 supplies the converted current signal $I_{in}$ to each of the inverters 212, 213, 214, and 215.

The five inverters 212 are connected in a ring shape, and so are the five inverters 215. The inverters 213 and 214 are connected to the inverters 212 different from one another and to the inverters 215 different from one another. For example, an input terminal of the inverter 213 is connected to an output terminal of the inverter 212, and an output terminal of the inverter 213 is connected to an output terminal of the inverter 215. Moreover, an input terminal of the inverter 214 is connected to the output terminal of the inverter 215, and an output terminal of the inverter 214 is connected to the output terminal of the inverter 212.

Owing to this connection, the inverter ring including the inverters 212 and the inverter ring including the inverters 215 are connected by latches including the inverters 213 and 214. Accordingly, differential symmetry of output waveforms of the respective inverter rings is increased, whereby the duty ratio of a waveform of an output signal is easily maintained at 50%.

In this configuration, the inverter 212 generates the voltage control oscillation signal having a frequency that depends on the level of the current signal $I_{in}$. Meanwhile, the inverter 215 generates the clock signal having the same frequency as the voltage control oscillation signal generated by the inverter 212 and having a phase different from that of the voltage control oscillation signal generated by the inverter 212 by a half cycle (in other words, having an inverted phase).

The five inverters 212 supply the voltage control oscillation signals VCO1 to VCO5 to the comparison unit 220, and the five inverters 215 supply the voltage control oscillation signals XVCO1 to XVCO5 to the comparison unit 220.

[Configuration Example of Comparison Unit]

Figure 4:
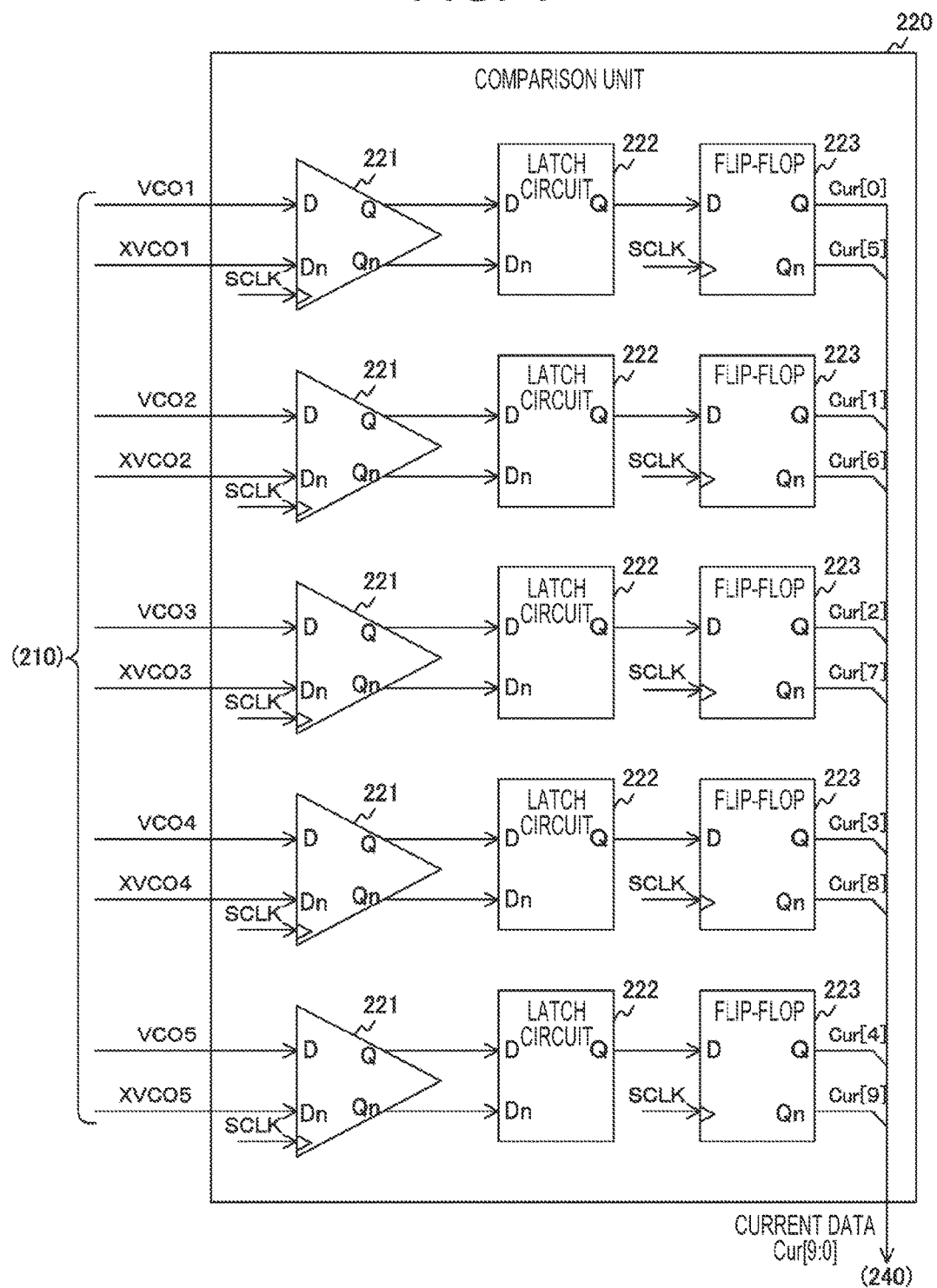
FIG. 4 is a circuit diagram illustrating a configuration example of a comparison unit according to the embodiment.

FIG. 4 is a circuit diagram illustrating a configuration example of the comparison unit 220 according to the embodiment. The comparison unit 220 includes an odd number of comparators 221, an odd number of latch circuits 222, and an odd number of flip-flops 223. For example, the number of comparators 221, the number of latch circuits 222, and the number of flip-flops 223 are all five.

The comparator 221 compares the two voltage control oscillation signals having the phases different from each other. The comparator 221 also includes a clock terminal, input terminals D and Dn, and output terminals Q and Qn. The sampling clock signal SCLK is input to the clock terminal. In addition, the voltage control oscillation signal VCOi is input to the input terminal D of the i-th (i is an integer of one to five) comparator 221, and the voltage control oscillation signal XVCOi is input to the input terminal Dn of the i-th comparator 221.

The comparator 221 compares respective levels of the voltage control oscillation signal VCOi and the voltage control oscillation signal XVCOi in synchronization with the sampling clock signal SCLK, and outputs the comparison result as a set signal from the output terminal Q. For example, a high level set signal is output when the voltage control oscillation signal VCOi is higher than the voltage control oscillation signal XVCOi, and a low level set signal is output in the other case. In addition, a signal obtained by inverting the set signal is output as a reset signal from the output terminal Qn.

The latch circuit 222 outputs the comparison result on the basis of the set signal and the reset signal from the comparator 221. In addition, the latch circuits 222 are connected to the comparators 221 different from one another, and each of the latch circuits 222 includes a set terminal D, a reset terminal Dn, and an output terminal Q. The set signal from the corresponding comparator 221 is input to the set terminal D, and the reset signal is input to the reset terminal Dn. The latch circuit 222 outputs a high level signal from the output terminal Q when the set signal is at a high level and the reset signal is at a low level, and outputs a low level signal from the output terminal Q when the set signal is at a low level and the reset signal is at a high level.

The flip-flops 223 hold the current bits. In addition, the flip-flops 223 are connected to the latch circuits 222 different from one another, and each of the flip-flops 223 includes a clock terminal, an input terminal D, and output terminals Q and Qn. The sampling clock signal SCLK is input to the clock terminal, and the input terminal D of the flip-flop 223 is connected to the output terminal Q of the corresponding latch circuit 222. The i-th flip-flop 223 holds the signal from the corresponding latch circuit 222 as a current bit Cur [i−1], and outputs the current bit Cur [i−1] from the output terminal Q in synchronization with the sampling clock signal SCLK. The flip-flop 223 also outputs a signal obtained by inverting the current bit Cur[i−1] as a current bit Cur[i+4] from the output terminal Qn. As a result, the current data Cur including the current bits Cur [0] to Cur [9] are output from the five flip-flops 223 to the digital signal generation unit 240.

FIG. 5 is a table illustrating an example of the operation of the comparator 221 according to the embodiment. The comparator 221 outputs the set signal "1" from the output terminal Q when the voltage control oscillation signal VCOi is higher than the voltage control oscillation signal XVCOi, and outputs the set signal "0" from the output terminal Q in the other case. The comparator 221 also outputs the reset signal obtained by inverting the set signal from the output terminal Qn.

FIG. 6 is a table illustrating an example of the operation of the latch circuit 222 according to the embodiment. The latch circuit 222 outputs the signal "0" from the output terminal Q when the set signal input to the input terminal D is "0" and the reset signal input to the input terminal Dn is "1". The latch circuit 222 also outputs the signal "1" from the output terminal Q when the set signal is "1" and the reset signal is "0". In addition, when both the set signal and the reset signal are "0", the latch circuit 222 shifts to a hold state in which the value of the output terminal Q is held.

FIG. 7 is a truth table illustrating an example of the operation of the flip-flop 223 according to the embodiment. The flip-flop 223 outputs the signal from the input terminal D as the current bit Cur [i−1] from the output terminal Q at the time of a rising edge of the sampling clock signal SCLK. The flip-flop 223 also holds the state of the output terminal Q in a period other than the rising edge of the sampling clock signal SCLK. The flip-flop 223 also outputs the signal obtained by inverting the current bit Cur [i−1] from the output terminal Qn.

[Configuration Example of Digital Signal Generation Unit]

Figure 8:
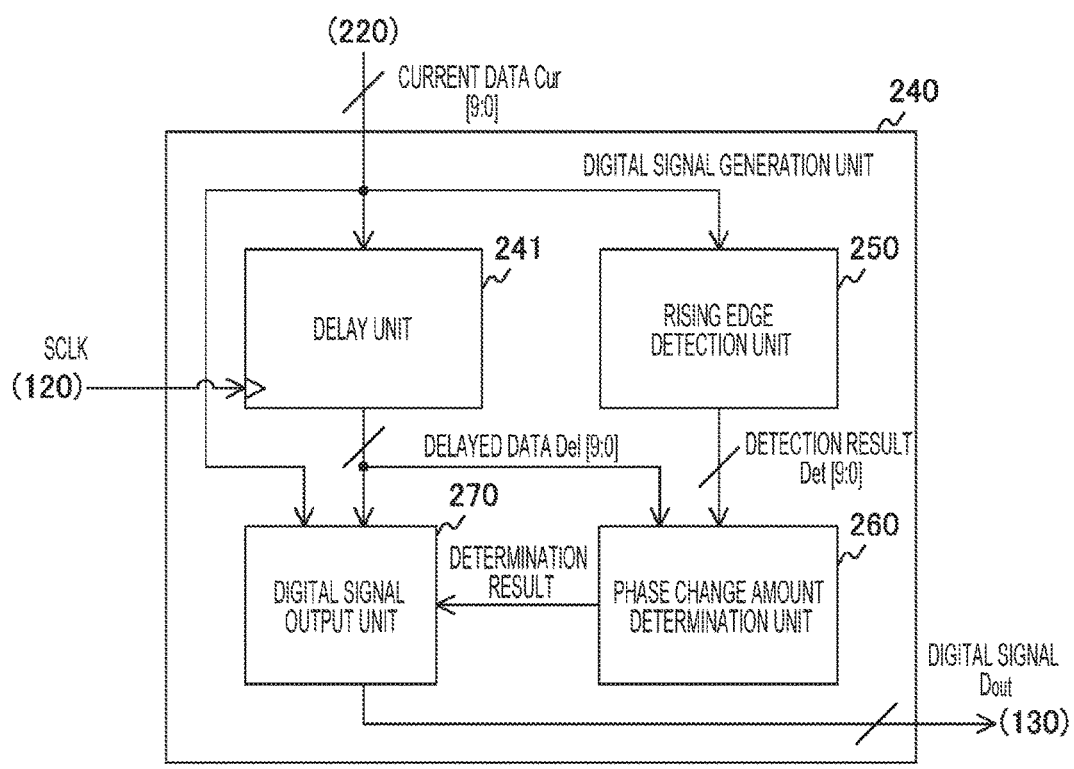
FIG. 8 is a block diagram illustrating a configuration example of a digital signal output unit according to the embodiment.

FIG. 8 is a block diagram illustrating a configuration example of the digital signal generation unit 240 according to the embodiment. The digital signal generation unit 240 includes a delay unit 241, a rising edge detection unit 250, a phase change amount determination unit 260, and a digital signal output unit 270.

The delay unit 241 delays the current data Cur over a cycle of the sampling clock signal SCLK. The delay unit 241 supplies the delayed current data Cur as delayed data Del to the phase change amount determination unit 260 and the digital signal output unit 270. Each bit in the delayed data Del is hereinafter referred to as a "delayed bit".

The rising edge detection unit 250 detects, on the basis of the current data Cur, the presence or absence of a rising edge of the voltage control oscillation signal VCO at each of the plurality of (e.g. ten) timings within the cycle of the voltage control oscillation signal VCO. The rising edge detection unit 250 supplies a detection result Det to the phase change amount determination unit 260. The detection result Det includes a plurality of detection bits [j]. As used herein, j is, for example, an integer of zero to nine. For example, a value "1" is set to the detection bit for the timing at which the presence of the rising edge is detected, and values "0" are set to the other detection bits. Note that the rising edge detection unit 250 is an example of an edge detection unit described in the claims.

The phase change amount determination unit 260 determines whether a change amount of the phase of the voltage control oscillation signal VCO (hereinafter referred to as a "phase change amount") in the cycle of the sampling clock signal SCLK is greater than a half cycle (180 degrees in angle notation) of the cycle. The phase change amount determination unit 260 determines whether the phase change amount is great as compared with the half cycle in accordance with whether values of the current bit and the delayed bit corresponding to the timing at which the presence of the rising edge is detected are the same. For example, when the values of the current bit and the delayed bit are the same, it is determined that the phase change amount is equal to or less than the half cycle. When the values are different, it is determined that the phase change amount is greater than the half cycle. The phase change amount determination unit 260 supplies a determination result to the digital signal output unit 270.

Note that the phase change amount determination unit 260 is an example of a determination unit described in the claims.

The digital signal output unit 270 generates and outputs the digital signal $D_{out}$ on the basis of the current data Cur, the delayed data Del, and the determination result. When the phase change amount is equal to or less than the half cycle, the digital signal output unit 270 generates the digital signal $D_{out}$ indicating a period in which the respective values of the delayed bit and the current bit form a specific combination. For example, the digital signal $D_{out}$ indicating the period in which the delayed bit is "0" and the current bit is "1" is generated.

On the other hand, when the phase change amount is greater than the half cycle, the digital signal output unit 270 generates the digital signal $D_{out}$ indicating a period in which the respective values of the delayed bit and the current bit are the same or form the aforementioned specific combination. For example, the digital signal $D_{out}$ indicating the period in which both the delayed bit and the current bit are "0" or "1", or the delayed bit is "0" and the current bit is "1" is generated. The digital signal output unit 270 outputs the generated digital signal $D_{out}$ to the digital signal processing unit 130. Note that the digital signal output unit 270 is an example of an output unit described in the claims.

[Configuration Example of Rising Edge Detection Unit]

Figure 9:
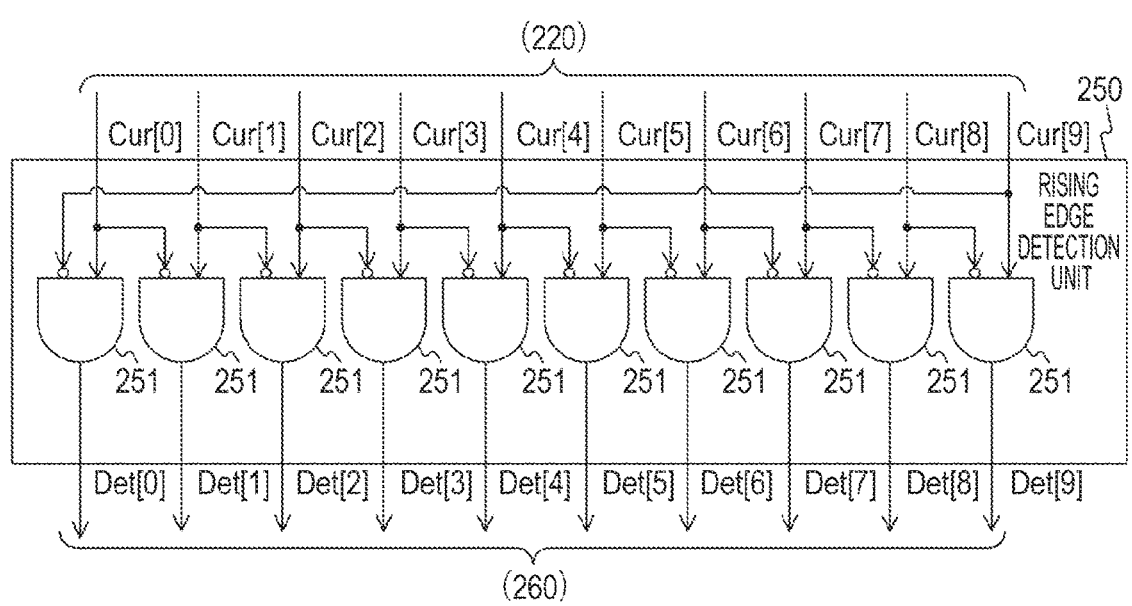
FIG. 9 is a circuit diagram illustrating a configuration example of a rising edge detection unit according to the embodiment.

FIG. 9 is a circuit diagram illustrating a configuration example of the rising edge detection unit 250 according to the embodiment. The rising edge detection unit 250 includes a plurality of (e.g. ten) AND (logical conjunction) gates 251.

The AND gate 251 outputs the logical conjunction of two logical values. The zeroth AND gate 251 outputs the logical conjunction of a value obtained by inverting the current bit Cur[9] and a value of the current bit Cur [0] as the detection bit Det [0]. The j-th AND gate 251 including the first and subsequent AND gates 251 outputs the logical conjunction of a value obtained by inverting the current bit Cur[j−1] and a value of the current bit Cur[j] as the detection bit Det[j].

[Configuration Example of Phase Change Amount Determination Unit]

Figure 10:
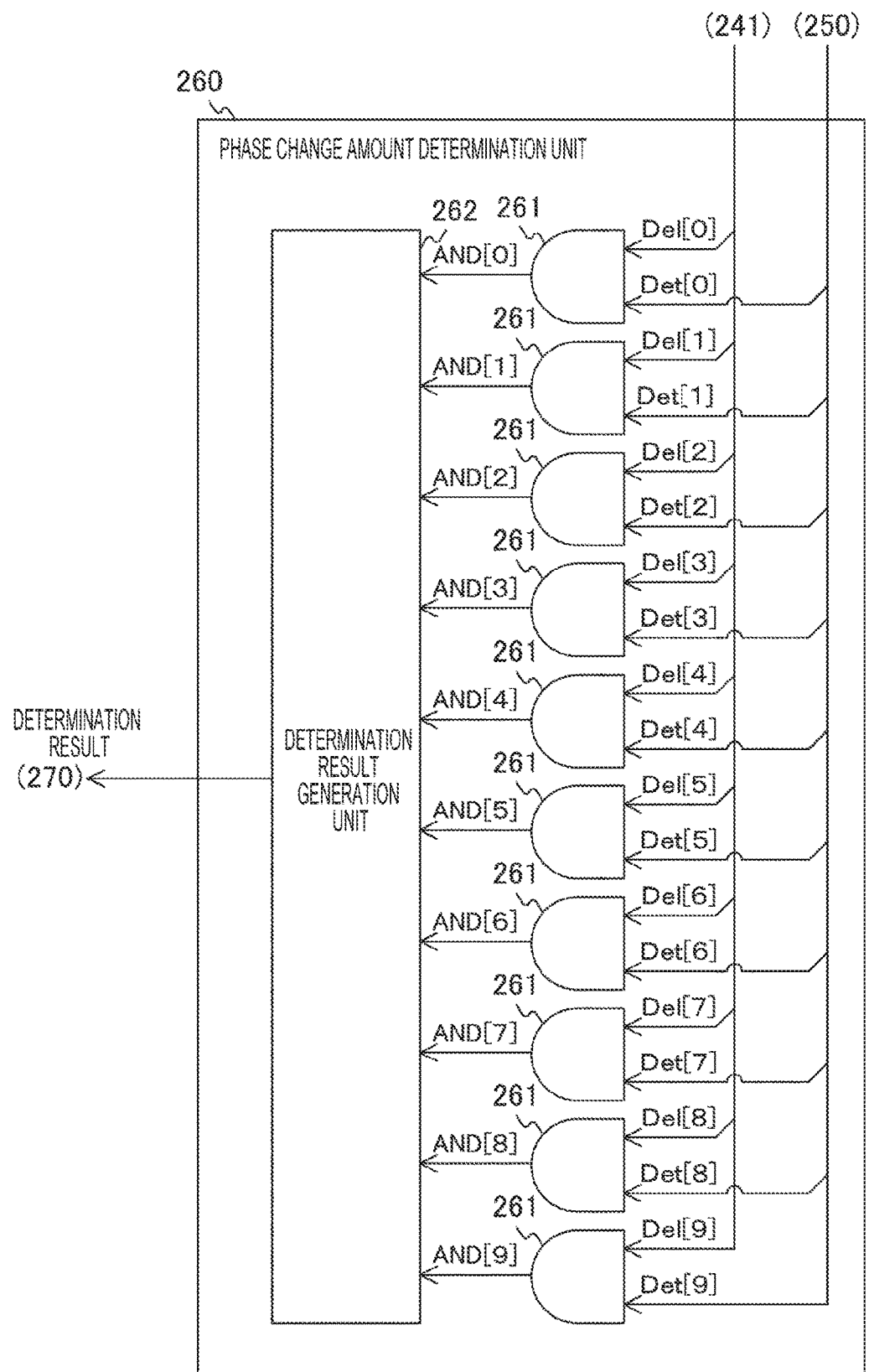
FIG. 10 is a circuit diagram illustrating a configuration example of a phase change amount determination unit according to the embodiment.

FIG. 10 is a circuit diagram illustrating a configuration example of the phase change amount determination unit 260 according to the embodiment. The phase change amount determination unit 260 includes a plurality of (e.g. ten) AND gates 261 and a determination result generation unit 262.

The AND gate 261 outputs the logical conjunction of two logical values. The j-th AND gate 261 supplies the logical conjunction of the delayed bit Del[j] and the detection bit Det[j] as AND[j] to the determination result generation unit 262.

The determination result generation unit 262 generates the determination result on the basis of AND[0] to AND[9]. The fact that all of AND[0] to AND[9] are "0" indicates that the values of the current bit and the delayed bit corresponding to the timing at which the presence of the rising edge is detected are different. In this case, the determination result generation unit 262 determines that the phase change amount is greater than the half cycle, and generates, for example, the determination result indicating a value "0".

On the other hand, the fact that any of AND[0] to AND[9] is "1" indicates that the values of the current bit and the delayed bit corresponding to the timing at which the presence of the rising edge is detected are the same. In this case, the determination result generation unit 262 determines that the phase change amount is equal to or less than the half cycle, and generates, for example, the determination result indicating a value "1".

FIG. 11 is a table illustrating an example of the operation of the determination result generation unit 262 according to the embodiment. When all of AND[0] to AND[9] are "0", the determination result generation unit 262 determines that the phase change amount is greater than the half cycle, and generates, for example, the determination result indicating the value "0". On the other hand, when any of AND[0] to AND[9] is "1", the determination result generation unit 262 determines that the phase change amount is equal to or less than the half cycle, and generates, for example, the determination result indicating the value "1".

Note that the determination result generation unit 262 may generate the determination result indicating the value "1" when it is determined that the phase change amount is greater than the half cycle, and may generate the determination result indicating the value "0" in the other case.

[Configuration Example of Digital Signal Output Unit]

Figure 12:
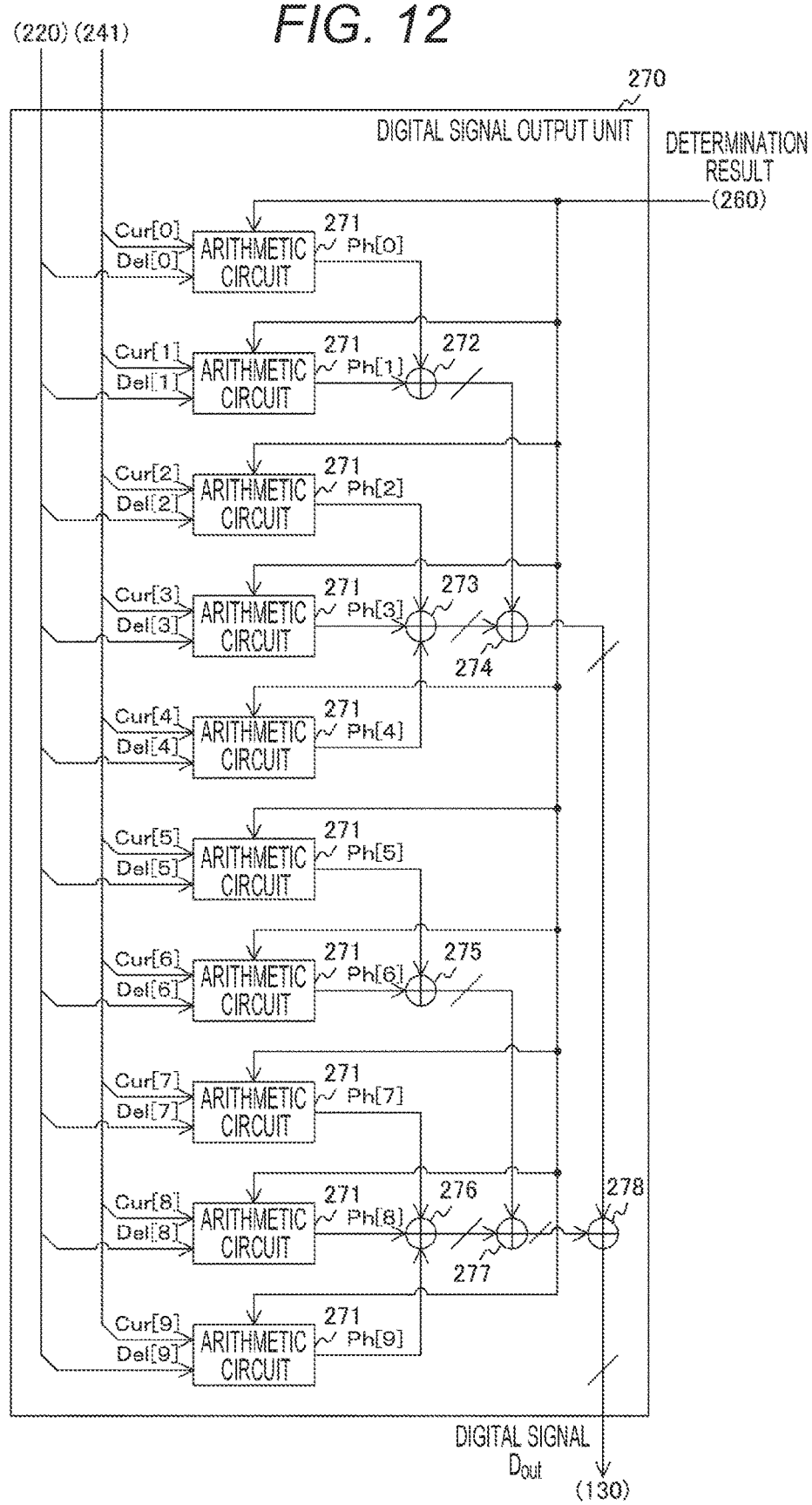
FIG. 12 is a circuit diagram illustrating a configuration example of a digital signal generation unit according to the embodiment.

FIG. 12 is a circuit diagram illustrating a configuration example of the digital signal output unit 270 according to the embodiment. The digital signal output unit 270 includes a plurality of (e.g. ten) arithmetic circuits 271 and adders 272 to 278.

The arithmetic circuit 271 judges whether the values of the current bit Cur[j] and the delayed bit Del[j] are the same or form the specific combination when the phase change amount is greater than the half cycle, and generates a bit indicating a judgment result as an arithmetic result Ph[j]. The specific combinations is, for example, a combination of the delayed bit Del[j] indicating "0" and the current bit Cur[j] indicating "1". In addition, for example, a value "1" is set to the arithmetic result Ph[j] when the values of the current bit Cur[j] and the delayed bit Del[j] are the same or form the specific combination, and a value "0" is set to the arithmetic result Ph[j] in the other case.

On the other hand, the arithmetic circuit 271 judges whether the values of the current bit [j] and the delayed bit Del[j] form the specific combination when the phase change amount is equal to or less than the half cycle, and generates a bit indicating a judgment result as an arithmetic result Ph[h]. For example, a value "1" is set to the arithmetic result Ph[j] when the values of the current bit Cur [j] and the delayed bit Del [j] form the specific combination, and a value "0" is set to the arithmetic result Ph[j] in the other case.

The adder 272 adds the values of the arithmetic results Ph[0] and Ph[1], and supplies an addition result to the adder 274. The adder 273 adds the respective values of the arithmetic results Ph[2], Ph[3], and Ph[4], and supplies an addition result to the adder 274. The adder 274 adds the respective addition results of the adders 272 and 273, and supplies it to the adder 278.

The adder 275 adds the values of the arithmetic results Ph[5] and Ph[6], and supplies it to the adder 277. The adder 276 adds the respective values of the arithmetic results Ph[7], Ph[8], and Ph[9], and supplies an addition result to the adder 277. The adder 277 adds the respective addition results of the adders 275 and 276, and supplies it to the adder 278.

The adder 278 adds the respective addition results of the adders 274 and 277, and outputs a signal indicating an addition result as the digital signal $D_{out}$.

FIG. 13 is a table illustrating an example of the operation of the arithmetic circuit 271 according to the embodiment. First, a case where the determination result has the value "0", that is, the phase change amount is greater than 180 degrees, is considered. In this case, the arithmetic circuit 271 generates the arithmetic result Ph[j] indicating "1" if either a condition that the delayed bit Del[j] is "0" and the current bit [j] is "1" or a condition that the values of the delayed bit Del[j] and the current bit [j] are the same is satisfied. On the other hand, the arithmetic circuit 271 generates the arithmetic result Ph[j] indicating "0" if these conditions are not satisfied.

To the contrary, in a case where the phase change amount is equal to or less than 180 degrees, the arithmetic result Ph[j] is generated using a different logical operation. In this case, the arithmetic circuit 271 generates the arithmetic result Ph[j] indicating "1" when the delayed bit Del[j] is "0" and the current bit [j] is "1", and generates the arithmetic result Ph[j] indicating "0" in the other case.

Figure 14:
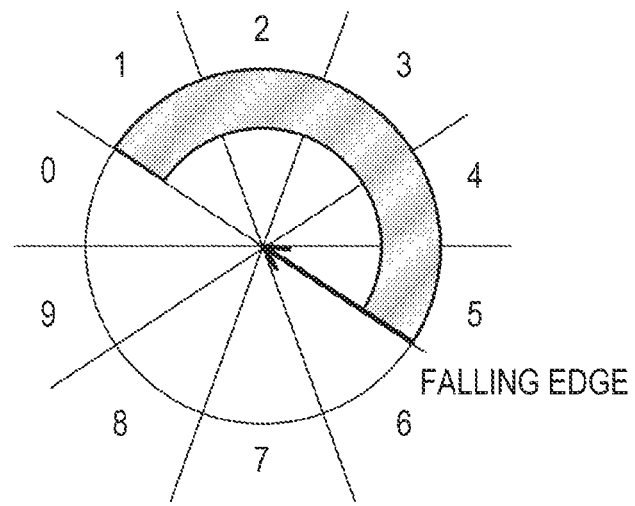
FIGS. 14($a$) and 14($b$) are diagrams illustrating examples of respective edge positions indicated by delayed data and current data when a phase change amount is equal to or less than 180 degrees according to the embodiment.
Figure 14:
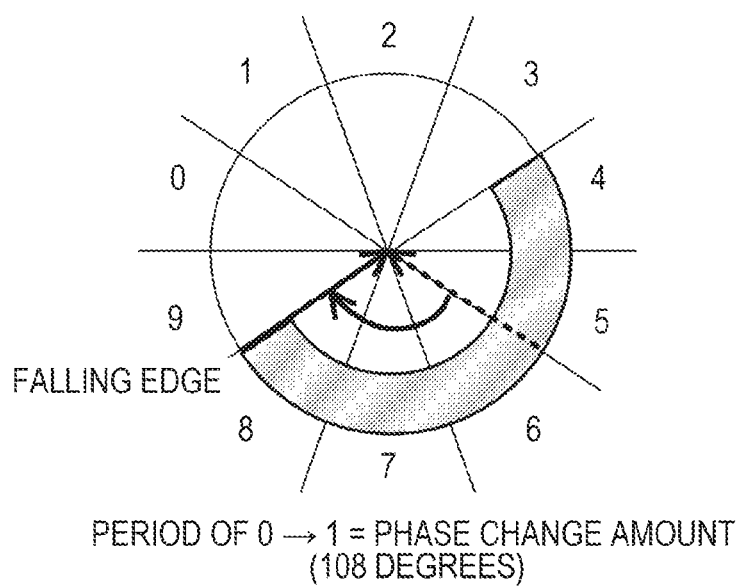

FIGS. 14(a) and 14(b) are diagrams illustrating examples of respective edge positions indicated by the delayed data and the current data when the phase change amount is equal to or less than 180 degrees according to the embodiment. In FIGS. 14(a) and 14(b), an angle, to a specific straight light, of each of ten straight lines extending radially from the center of the circle indicates the phase at each of the timings obtained by dividing the cycle of the voltage control oscillation signal into ten. Since 360 degrees are divided into ten, the respective timings are different from each other by 36 degrees. In addition, a section with diagonal lines indicates a period in which the value of the voltage control oscillation signal is "1".

A diagram of an example of the timing of a falling edge of the voltage control oscillation signal VCO indicated by the delayed data is illustrated in FIG. 14(a). In this example, the fifth timing is the timing of the falling edge. In addition, a diagram of an example of the timing of the falling edge of the voltage control oscillation signal VCO indicated by the current data is illustrated in FIG. 14(b). In this example, the eighth timing is the falling edge. From these results, the phase change amount within the period of the sampling clock signal SCLK is 108 (=3×36) degrees. The phase change amount is equal to a period in which the value of the voltage control oscillation signal VCO is changed from "0" to "1".

FIGS. 15(a) to 15(f) are diagrams for explaining an arithmetic method that is applied when the phase change amount is equal to or less than 180 degrees according to the embodiment. A diagram of an example of the delayed data Del generated by the delay unit 241 is illustrated in FIG. 15(a). In FIG. 15(a), a thick solid line indicates a waveform of the voltage control oscillation signal VCO. In addition, the delayed data Del include the ten delayed bits, and each bit indicates the value of the voltage control oscillation signal VCO at each of the timings obtained by dividing the cycle of the voltage control oscillation signal VCO into ten.

A diagram of an example of the current data Cur generated by the comparison unit 220 is illustrated in FIG. 15(b). In FIG. 15(b), a thick solid line indicates a waveform of the voltage control oscillation signal VCO. In addition, the current data Cur include the ten current bits, and each bit indicates the value of the voltage control oscillation signal VCO at each of the timings obtained by dividing the cycle of the voltage control oscillation signal VCO into ten.

A diagram of an example of the detection result Det of the rising edge detected from the current data by the rising edge detection unit 250 is illustrated in FIG. 15(c). The detection result Det includes the ten detection bits, and each bit indicates the presence or absence of the rising edge at each of the timings obtained by dividing the cycle of the voltage control oscillation signal VCO into ten. In this example, the presence of the rising edge is detected at the fourth detection bit.

A diagram of an example of AND[0] to AND[9] generated by the AND gates 261 is illustrated in FIG. 15(d). The logical conjunction of the delayed bit and the detection result bit is generated as each of AND[0] to AND[9]. Since the presence of the rising edge is detected at the fourth bit, and the fourth delayed bit is also "1", AND[4] which is the logical conjunction of them has the value "1". The fact that AND[4] is "1" indicates that the current bit and the delayed bit corresponding to the fourth timing at which the presence of the rising edge is detected have the same value.

Figure 15:
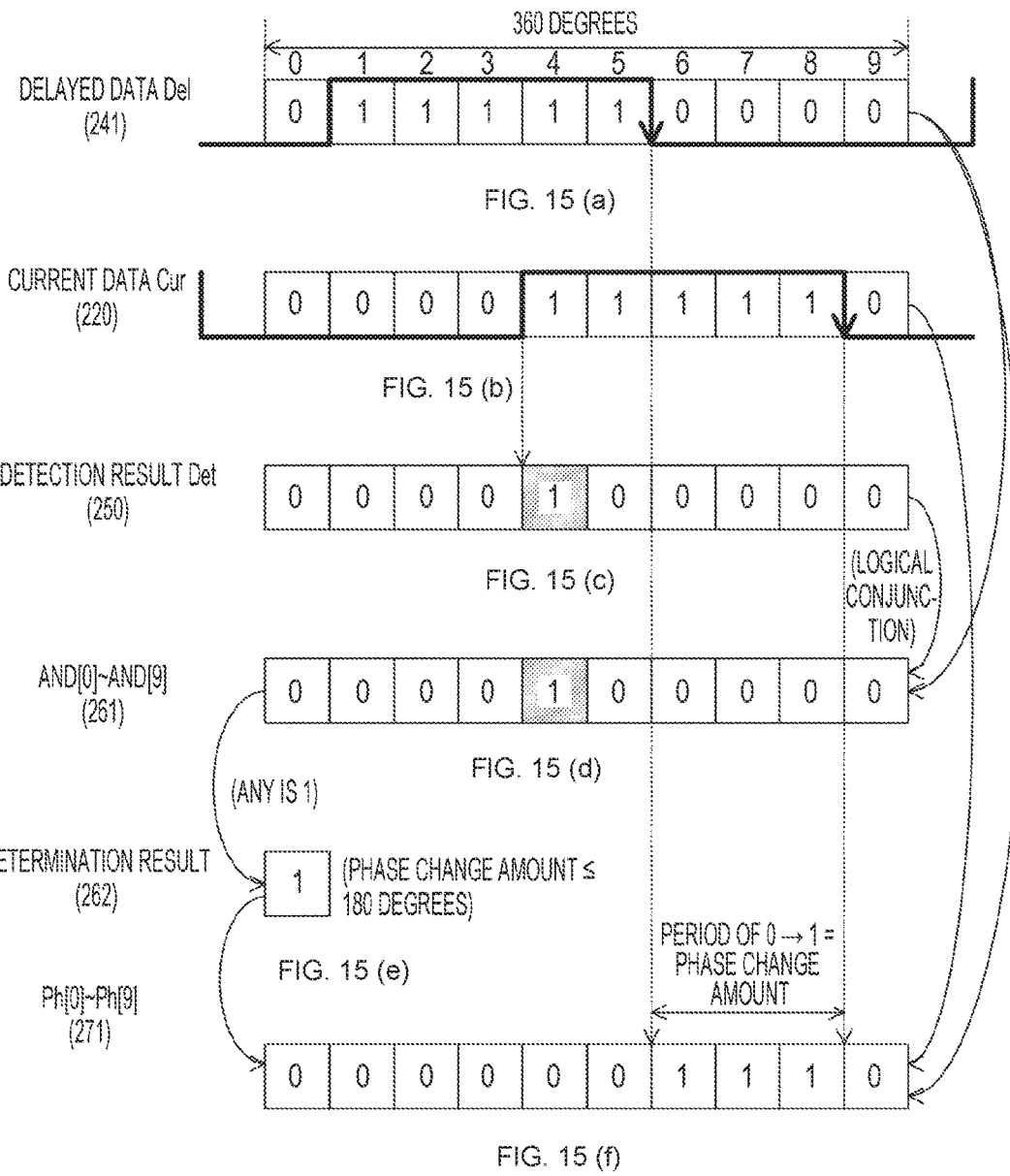
FIGS. 15(a) to 15(f) are diagrams for explaining an arithmetic method that is applied when the phase change amount is equal to or less than 180 degrees according to the embodiment.

A diagram of an example of the determination result generated by the determination result generation unit 262 is illustrated in FIG. 15(*e*). Since AND[5] is "1", the determination result "1" indicating that the phase change amount is equal to or less than 180 degrees is generated.

A diagram of an example of the arithmetic results Ph[j] provided by the arithmetic circuits 271 is illustrated in FIG. 15(*f*). When the phase change amount is equal to or less than 180 degrees, the arithmetic circuit 271 generates the arithmetic result "j" indicating the value "1" at the timing at which the delayed bit is "0" and the current bit is "1". In this example, since the delayed bits are "0" and the current bits are "1" at the sixth to eighth timings, the arithmetic results Ph "6" to Ph "8" indicating the values "1" are generated. The period "3" including these timings is calculated as the phase change amount.

Figure 16:
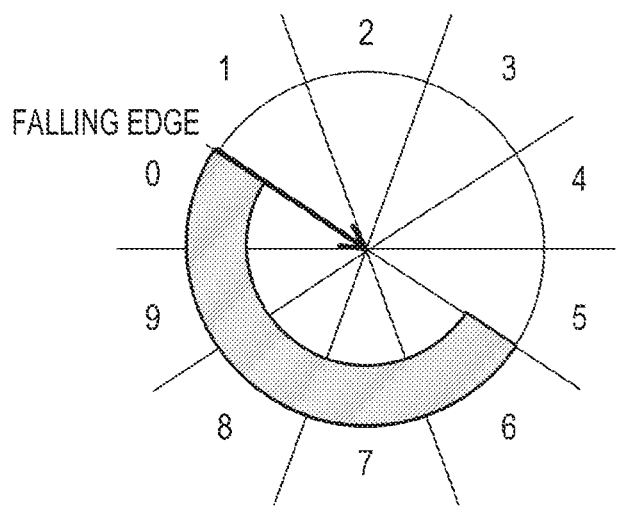
FIGS. 16(a) and 16(b) are diagrams illustrating examples of the respective edge positions indicated by the delayed data and the current data when the phase change amount exceeds 180 degrees according to the embodiment.
Figure 16:
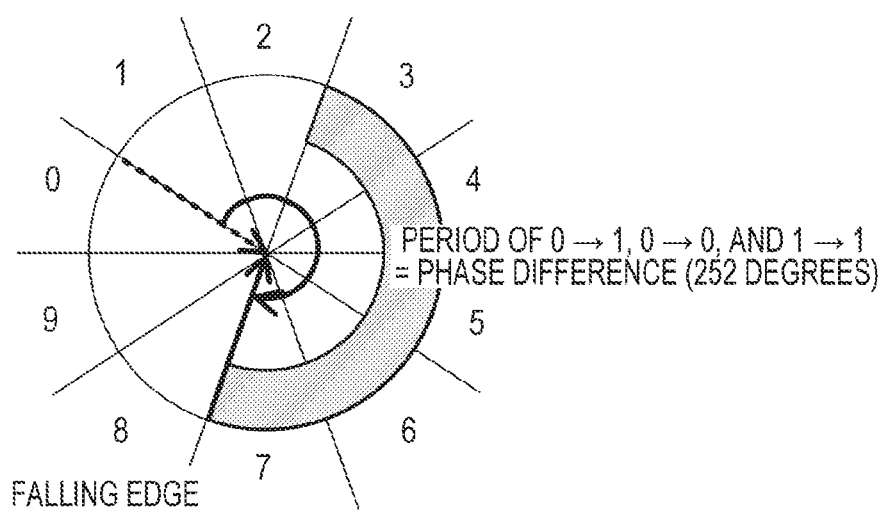

FIGS. 16(*a*) and 16(*b*) are diagrams illustrating examples of the respective edge positions indicated by the delayed data and the current data when the phase change amount is greater than 180 degrees according to the embodiment. A diagram of an example of the timing of the falling edge of the voltage control oscillation signal VCO indicated by the delayed data is illustrated in FIG. 16(*a*). In this example, the zeroth timing is the timing of the falling edge. In addition, a diagram of an example of the timing of the falling edge of the voltage control oscillation signal VCO indicated by the current data is illustrated in FIG. 16(*b*). In this example, the seventh timing is the falling edge. From these results, the phase change amount within the period of the sampling clock signal SCLK is 252 (=7×36) degrees. The phase change amount is equal to the sum of a period in which the value of the voltage control oscillation signal VCO is changed from "0" to "1" and a period in which the value is not changed.

Figure 17:
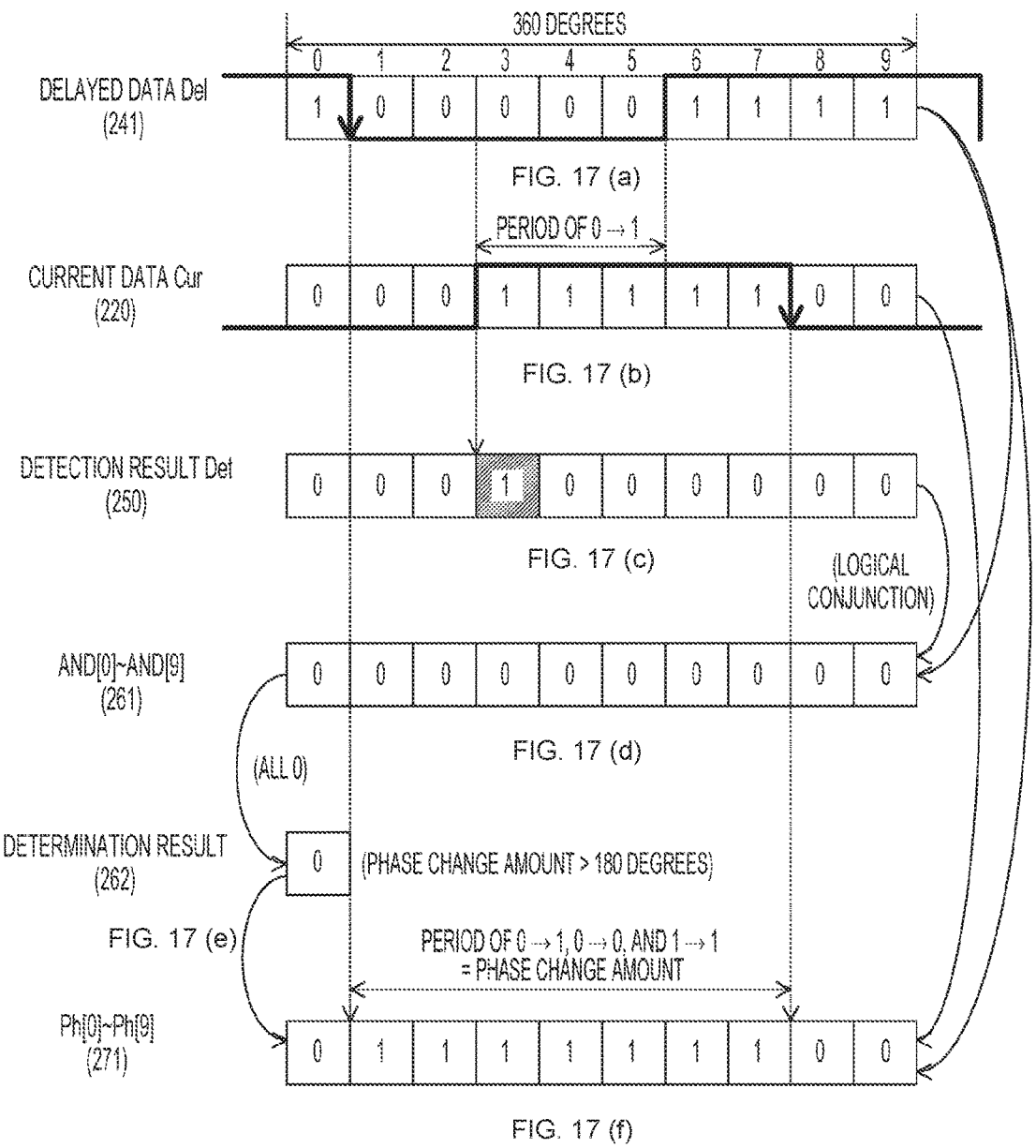
FIGS. 17(a) to 17(f) are diagrams for explaining an arithmetic method that is applied when the phase change amount exceeds 180 degrees according to the embodiment.

FIGS. 17(*a*) to 17(*f*) are diagrams for explaining an arithmetic method that is applied when the phase change amount is greater than 180 degrees according to the embodiment. A diagram of an example of the delayed data Del generated by the delay unit 241 is illustrated in FIG. 17(*a*). A diagram of an example of the current data Cur generated by the comparison unit 220 is illustrated in FIG. 17(*b*).

A diagram of an example of the detection result Det of the rising edge detected from the current data by the rising edge detection unit 250 is illustrated in FIG. 17(*c*). In this example, the presence of the rising edge is detected at the third detection bit.

A diagram of an example of AND[0] to AND[9] generated by the AND gates 261 is illustrated in FIG. 17(*d*). Since the presence of the rising edge is detected at the third bit, and the third delayed bit is "0", AND[3] which is the logical conjunction of them has the value "0". The fact that AND[3] is "0" indicates that the current bit and the delayed bit corresponding to the third timing at which the presence of the rising edge is detected have the different values.

A diagram of an example of the determination result generated by the determination result generation unit 262 is illustrated in FIG. 17(*e*). Since all the values of AND[j] are "0", the determination result "0" indicating that the phase change amount is greater than 180 degrees is generated.

A diagram of an example of the arithmetic results Ph[j] provided by the arithmetic circuits 271 is illustrated in FIG. 17(*f*). When the phase change amount is greater than 180 degree, the arithmetic circuit 271 generates the arithmetic result Ph "j" indicating the value "1" at the timing at which the delayed bit is "0" and the current bit is "1", and the timing at which the values of the delayed bit and the current bit are the same. In this example, the arithmetic results Ph "1" to Ph "7" indicating the values "1" are generated at the first to seventh timings. The period "7" including these timings is calculated as the phase change amount.

If the period in which the delayed bit is "0" and the current bit is "1" is obtained without the determination as to whether the phase change amount is greater than 180 degrees, the phase change amount "3" is calculated from FIGS. 15(*a*) and 15(*b*). This phase change amount is not the accurate value ("7"). As a result, the S/N ratio of the analog-to-digital converter might be reduced.

To the contrary, the analog-to-digital converter 200 according to the embodiment switches the arithmetic method in accordance with whether the phase change amount within the sampling period is greater than 180 in the clock signal having the cycle that depends on the signal level of the analog signal. Therefore, the analog-to-digital converter 200 can calculate the accurate phase change amount even when the phase change amount is greater than 180 degrees.

[Operation Example of Analog-to-Digital Converter]

Figure 18:
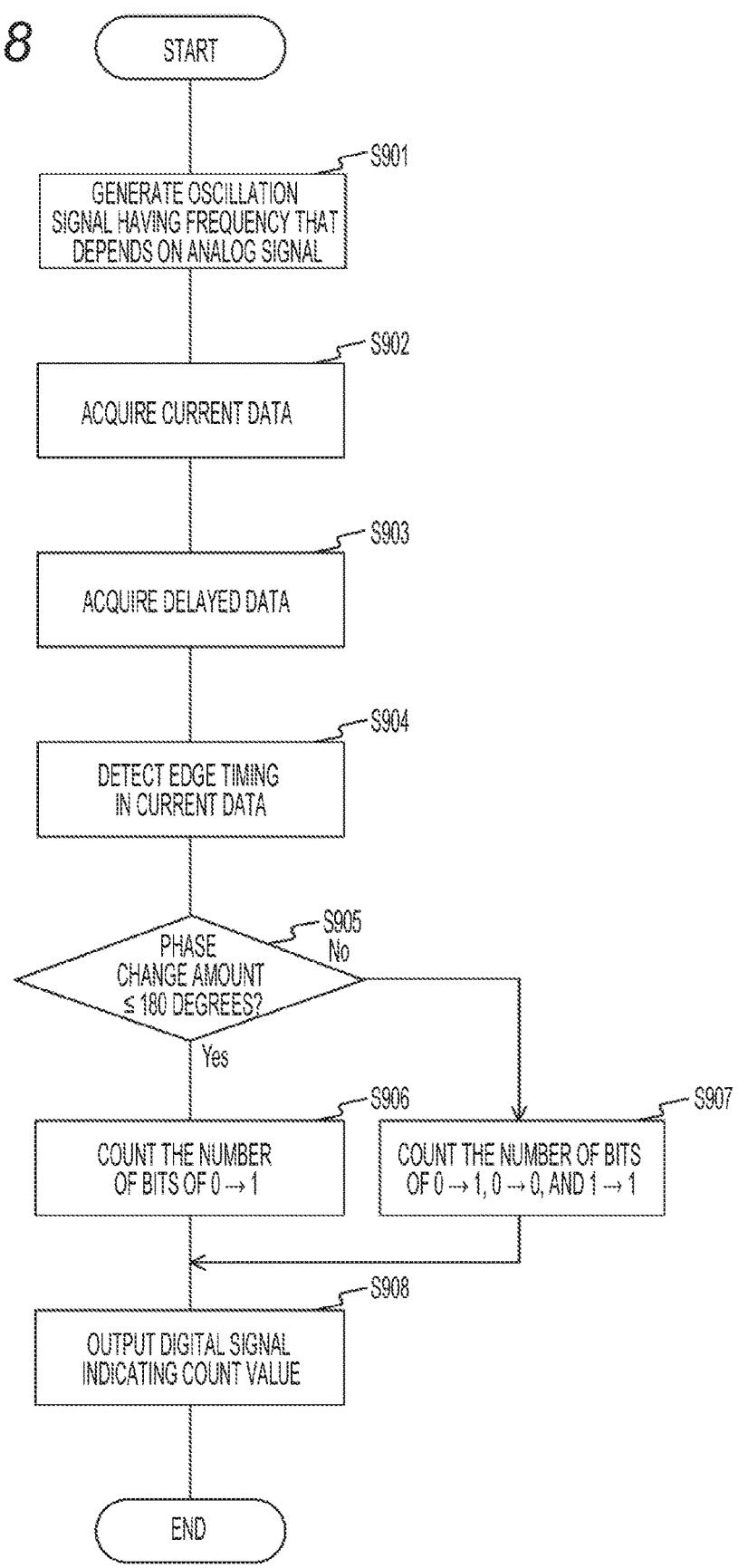
FIG. 18 is a flowchart illustrating an example of operation of the analog-to-digital converter according to the embodiment.

FIG. 18 is a flowchart illustrating an example of the operation of the analog-to-digital converter 200 according to the embodiment. The operation is repeatedly executed, for example, in synchronization with the sampling clock signal SCLK.

The analog-to-digital converter 200 generates the voltage control oscillation signal VCO having a frequency that depends on the signal level of the analog signal (step S901). The analog-to-digital converter 200 acquires the current data (step S902), and acquires the delayed data (step S903). The analog-to-digital converter 200 also detects the rising edge timing in the current data (step S904).

Then, the analog-to-digital converter 200 determines whether the phase change amount is equal to or less than 180 degrees in accordance with whether the current bit and the past bit corresponding to the detected edge timing have the same value (step S905).

When the phase change amount is equal to or less than 180 degrees (step S905: Yes), the analog-to-digital converter 200 counts the number of bits changed from "0" to "1" (step S906). On the other hand, when the phase change amount is greater than 180 degrees (step S905: No), the analog-to-digital converter 200 counts the number of bits changed from "0" to "1" and bits whose values are not changed (step D907). After step S906 or S907, the analog-to-digital converter 200 generates and outputs the digital signal indicating the count value (step S908). After step S908, the analog-to-digital converter 200 ends the sampling operation.

As described above, according to the embodiment of the present technology, the analog-to-digital converter determines whether the phase change amount is greater than the half cycle in the clock signal having the cycle that depends on the signal level of the analog signal. Therefore, the analog-to-digital converter can accurately obtain the phase change amount from the determination result. Consequently, the analog signal can be accurately converted into the digital signal.

2. First Modification

According to the first embodiment, the analog-to-digital converter 200 detects the rising edge. Alternatively, the falling edge may be detected instead of the rising edge. The analog-to-digital converter 200 according to a first modification is different from that of the embodiment in detecting the falling edge instead of the rising edge.

The digital signal generation unit 240 according to the first modification includes a falling edge detection unit 280 in place of the rising edge detection unit 250.

Figure 19:
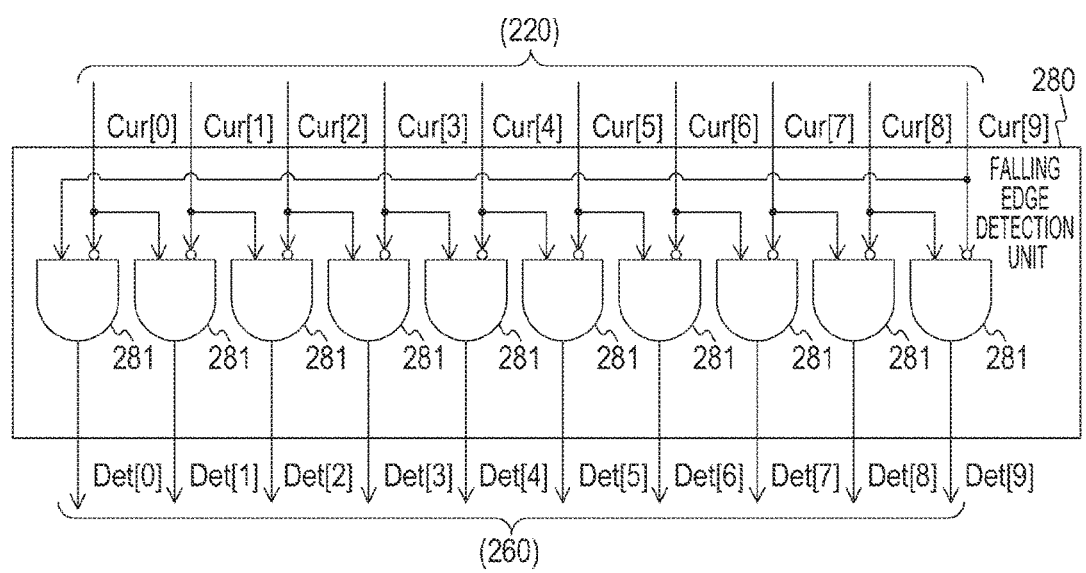
FIG. 19 is a circuit diagram illustrating a configuration example of a falling edge detection unit according to a first modification of the embodiment.

FIG. 19 is a circuit diagram illustrating a configuration example of the falling edge detection unit 280 according to the first modification of the embodiment. The falling edge detection unit 280 includes a plurality of (e.g. ten) AND (logical conjunction) gates 281.

The AND gate 281 outputs the logical conjunction of two logical values. The zeroth AND gate 281 outputs the logical conjunction of a value of the current bit Cur[9] and a value obtained by inverting the current bit Cur[0] as the detection bit Det[0]. The j-th AND gate 281 including the first and subsequent AND gates 281 outputs the logical conjunction of a value of the current bit Cur[j−1] and a value obtained by inverting the current bit Cur[j] as the detection bit Det[j].

In addition, the determination result generation unit 262 according to the first modification determines that the phase change amount is equal to or less than the half cycle when all of AND[0] to AND[9] are "0", and generates the determination result indicating the value "0". On the other hand, when any of AND[0] to AND[9] is "1", the determination result generation unit 262 determines that the phase change amount is greater than the half cycle, and generates the determination result indicating the value "1".

Figure 20:
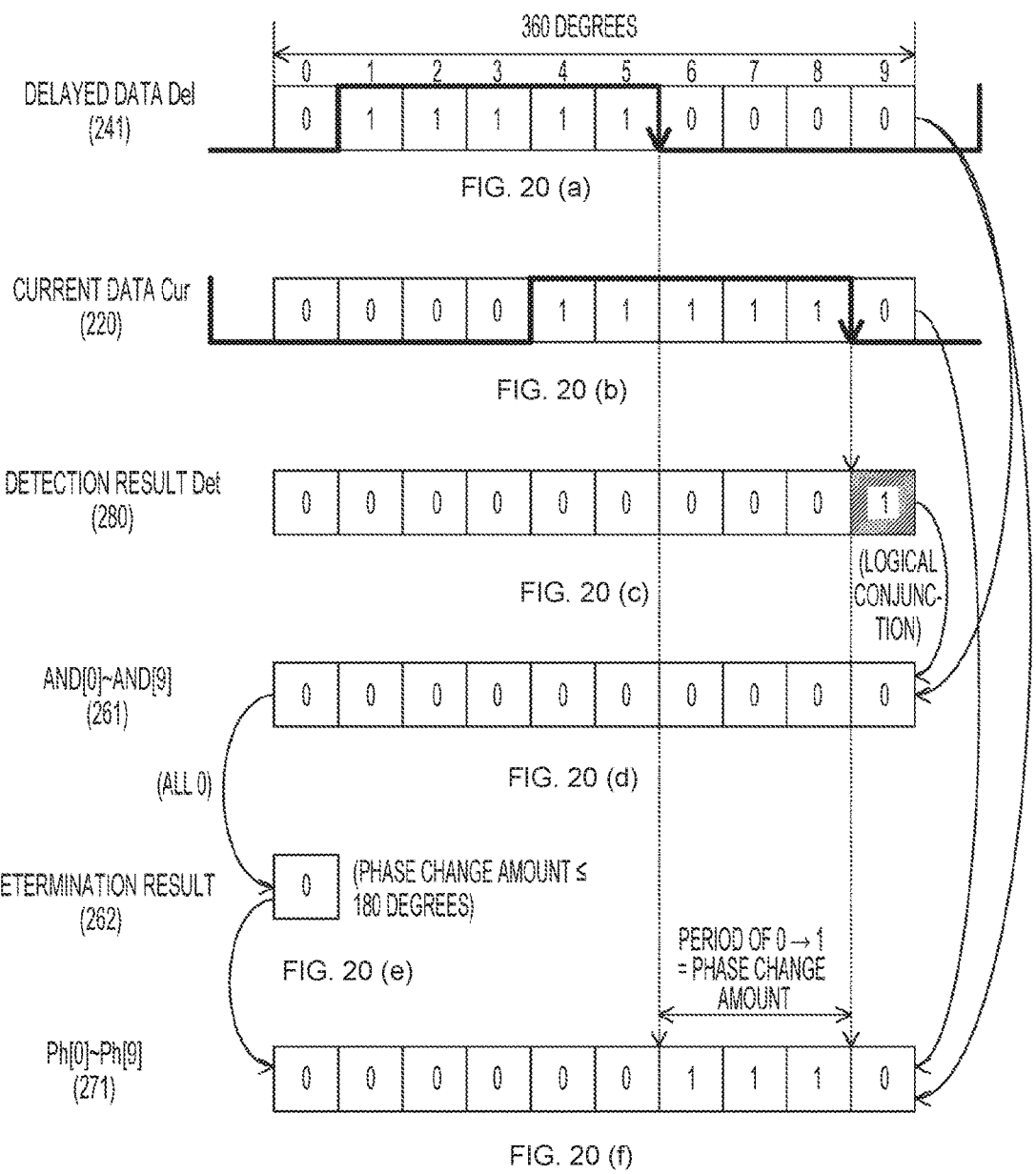
FIGS. 20(a) to 20(f) are diagrams for explaining an arithmetic method that is applied when the phase change amount is equal to or less than 180 degrees according to the first modification of the embodiment.

FIGS. 20(*a*) to 20(*f*) are diagrams for explaining an arithmetic method that is applied when the phase change amount is equal to or less than 180 degrees according to the first modification of the embodiment. A diagram of an example of the delayed data Del generated by the delay unit 241 is illustrated in FIG. 20(*a*). A diagram of an example of the current data Cur generated by the comparison unit 220 is illustrated in FIG. 20(*b*).

A diagram of an example of the detection result Det of the falling edge detected from the current data by the falling edge detection unit 280 is illustrated in FIG. 20(*c*). In this example, the presence of the falling edge is detected at the ninth detection bit.

A diagram of an example of AND[0] to AND[9] generated by the AND gates 261 is illustrated in FIG. 20(*d*). Since the presence of the falling edge is detected at the ninth bit, and the ninth delayed bit is "0", AND[9] which is the logical conjunction of them has the value "0". The fact that AND[9] is "0" indicates that the current bit and the delayed bit corresponding to the ninth timing at which the presence of the falling edge is detected have the same value.

A diagram of an example of the determination result generated by the determination result generation unit 262 is illustrated in FIG. 20(*e*). Since all the values of AND[j] are "0", the determination result "0" indicating that the phase change amount is equal to or less than 180 degrees is generated.

A diagram of an example of the arithmetic results Ph[j] provided by the arithmetic circuits 271 is illustrated in FIG. 20(*f*). In a manner similar to that for the embodiment, the arithmetic results Ph[6] to Ph[8] indicating the values "1" are generated at the sixth to eighth timings.

Figure 21:
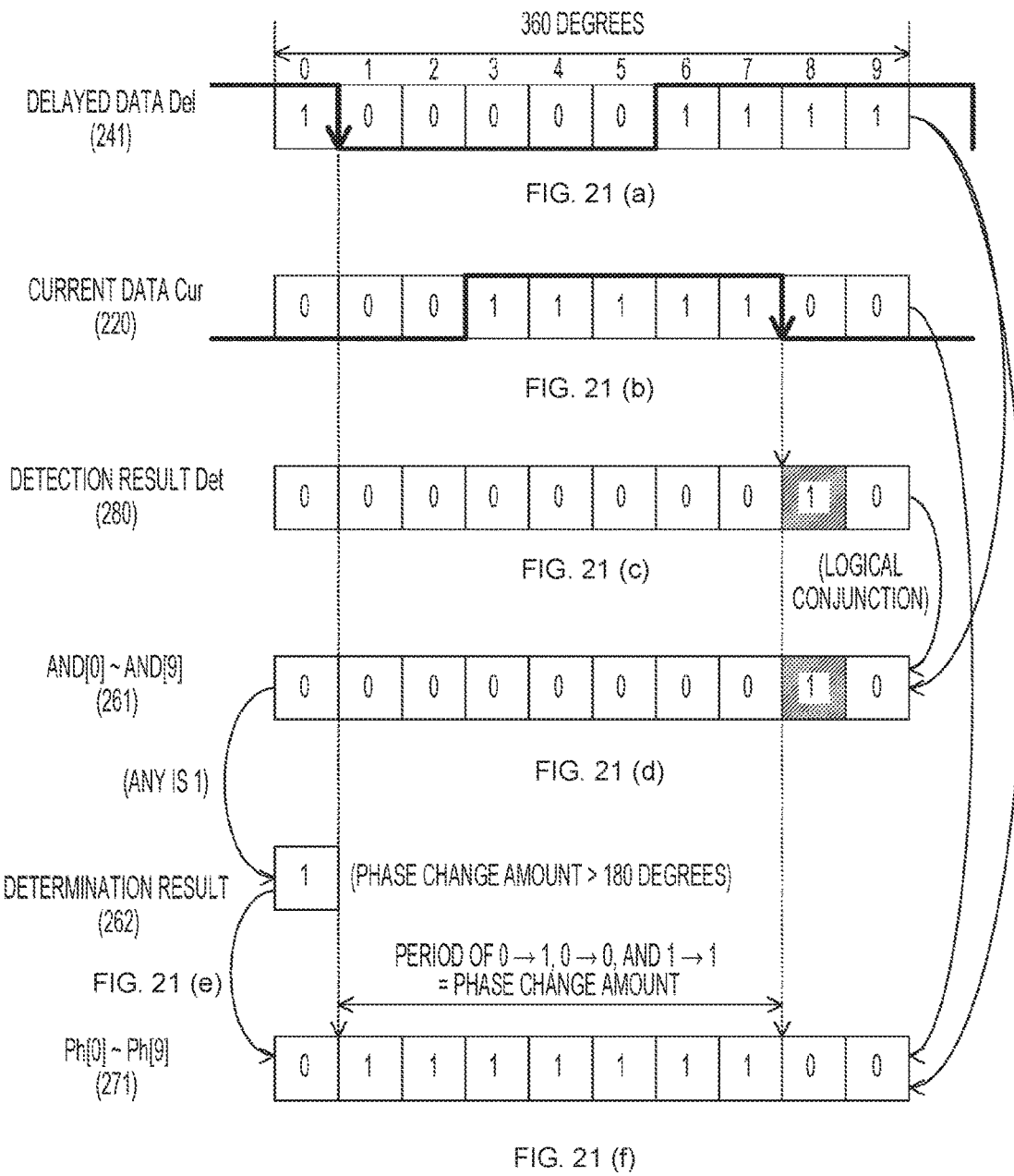
FIGS. 21(a) to 21(f) are diagrams for explaining an arithmetic method that is applied when the phase change amount exceeds 180 degrees according to the first modification of the embodiment.

FIGS. 21(*a*) to 21(*f*) are diagrams for explaining an arithmetic method that is applied when the phase change amount exceeds 180 degrees according to the first modification of the embodiment. A diagram of an example of the delayed data Del generated by the delay unit 241 is illustrated in FIG. 21(*a*). A diagram of an example of the current data Cur generated by the comparison unit 220 is illustrated in of FIG. 21(*b*).

A diagram of an example of the detection result Det of the falling edge detected from the current data by the falling edge detection unit 280 is illustrated in FIG. 21(*c*). In this example, the presence of the falling edge is detected at the eighth detection bit.

A diagram of an example of AND[0] to AND[9] generated by the AND gates 261 is illustrated in FIG. 21(*d*). Since the presence of the falling edge is detected at the eighth bit, and the eighth delayed bit is "1", AND[8] which is the logical conjunction of them has the value "1". The fact that AND[8] is "1" indicates that the current bit and the delayed bit corresponding to the eighth timing at which the presence of the falling edge is detected have the different values.

A diagram of an example of the determination result generated by the determination result generation unit 262 is illustrated in FIG. 21(*e*). Since AND[8] is "1", the determination result "1" indicating that the phase change amount is greater than 180 degrees is generated.

A diagram of an example of the arithmetic results Ph[j] provided by the arithmetic circuits 271 is illustrated in FIG. 21(*f*). In a manner similar to that for the embodiment, the arithmetic results Ph[1] to Ph[7] indicating the values "1" are generated at the first to seventh timings.

As described above, according to the first modification, the analog-to-digital converter 200 detects the falling edge from the current data. Therefore, the analog-to-digital converter 200 can determine whether the phase change amount is greater than the half cycle from the detection result of the falling edge and the delayed data.

3. Second Modification

According to the first embodiment, the analog-to-digital converter 200 detects the rising edge from the current data Cur. Alternatively, the rising edge may be detected from the delayed data Del. The analog-to-digital converter 200 according to the first modification is different from that of the embodiment in detecting the rising edge from the delayed data Del.

Figure 22:
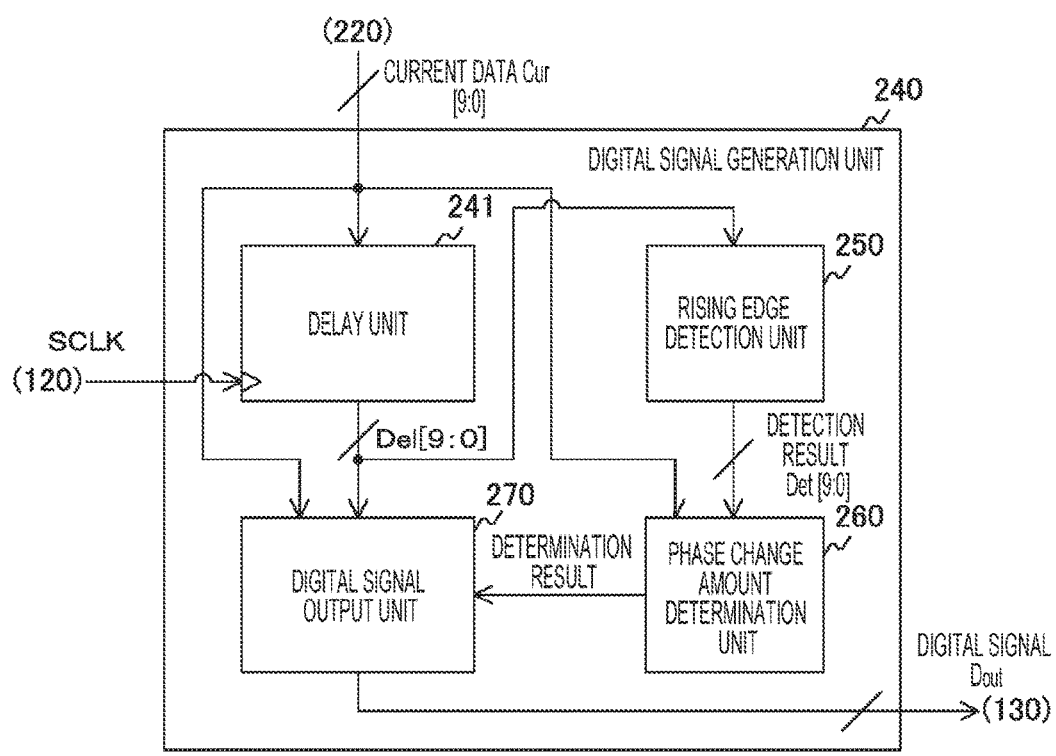
FIG. 22 is a block diagram illustrating a configuration example of the digital signal generation unit according to a second modification of the embodiment.

FIG. 22 is a block diagram illustrating a configuration example of the digital signal generation unit 240 according to the second modification of the embodiment. The delayed data Del are input to the rising edge detection unit 250 according to the second modification instead of the current data Cur. In addition, the detection result Det and the current data Cur are input to the phase change amount determination unit 260 according to the second modification. Meanwhile, the configuration of the determination result generation unit 262 in the phase change amount determination unit 260 according to the second modification is similar to that of the first modification.

FIGS. 23(*a*) to 23(*f*) are diagrams for explaining an arithmetic method that is applied when the phase change amount is equal to or less than 180 degrees according to the second modification of the embodiment. A diagram of an example of the delayed data Del generated by the delay unit 241 is illustrated in FIG. 23(*a*). A diagram of an example of the current data Cur generated by the comparison unit 220 is illustrated in FIG. 23(*b*).

A diagram of an example of the detection result Det of the rising edge detected from the delayed data by the rising edge detection unit 250 is illustrated in FIG. 23(*c*). In this example, the presence of the rising edge is detected at the first detection bit.

A diagram of an example of AND[0] to AND[9] generated by the AND gates 261 is illustrated in FIG. 23(*d*). Since the presence of the rising edge is detected at the first bit, and the first current bit is "0", AND[1] which is the logical conjunction of them has the value "0". The fact that AND[1] is "0" indicates that the current bit and the delayed bit corresponding to the first timing at which the presence of the rising edge is detected have the different values.

A diagram of an example of the determination result generated by the determination result generation unit 262 is illustrated in FIG. 23(e). Since all the values of AND[j] are "0", the determination result "0" indicating that the phase change amount is equal to or less than 180 degrees is generated.

A diagram of an example of the arithmetic results Ph[j] provided by the arithmetic circuits 271 is illustrated in FIG. 23(f). In a manner similar to that for the embodiment, the arithmetic results Ph[6] to Ph[8] indicating the values "1" are generated at the sixth to eighth timings.

FIGS. 24(a) to 24(f) are diagrams for explaining an arithmetic method that is applied when the phase change amount exceeds 180 degrees according to the second modification of the embodiment. A diagram of an example of the delayed data Del generated by the delay unit 241 is illustrated in FIG. 24(a). A diagram of an example of the current data Cur generated by the comparison unit 220 is illustrated in FIG. 24(b).

A diagram of an example of the detection result Det of the rising edge detected from the delayed data by the rising edge detection unit 250 is illustrated in FIG. 24(c). In this example, the presence of the rising edge is detected at the sixth detection bit.

A diagram of an example of AND[0] to AND[9] generated by the AND gates 261 is illustrated in FIG. 24(d). Since the presence of the rising edge is detected at the sixth bit, and the sixth current bit is "1", AND[6] which is the logical conjunction of them has the value "1". The fact that AND[6] is "1" indicates that the current bit and the delayed bit corresponding to the sixth timing at which the presence of the rising edge is detected have the same value.

A diagram of an example of the determination result generated by the determination result generation unit 262 is illustrated in FIG. 24(e). Since AND[6] is "1", the determination result "1" indicating that the phase change amount is greater than 180 degrees is generated.

A diagram of an example of the arithmetic results Ph[j] provided by the arithmetic circuits 271 is illustrated in FIG. 24(f). In a manner similar to that for the embodiment, the arithmetic results Ph[1] to Ph[1] indicating the values "1" are generated at the first to seventh timings.

As described above, according to the second modification, the analog-to-digital converter 200 detects the rising edge from the delayed data. Therefore, the analog-to-digital converter 200 can determine whether the phase change amount is greater than the half cycle from the detection result and the current data.

4. Third Modification

According to the first embodiment, the analog-to-digital converter 200 detects the rising edge from the current data Cur. Alternatively, the falling edge may be detected from the delayed data Del. The analog-to-digital converter 200 according to a third modification is different from that of the embodiment in detecting the falling edge from the delayed data Del.

The digital signal generation unit 240 according to the third modification is different from the configuration of the second modification exemplified in FIG. 22 in providing the falling edge detection unit 280 according to the first modification in place of the rising edge detection unit 250.

FIGS. 25(a) to 25(f) are diagrams for explaining an arithmetic method that is applied when the phase change amount is equal to or less than 180 degrees according to the third modification of the embodiment. A diagram of an example of the delayed data Del generated by the delay unit 241 is illustrated in FIG. 25(a). A diagram of an example of the current data Cur generated by the comparison unit 220 is illustrated in FIG. 25(b).

A diagram of an example of the detection result Det of the falling edge detected from the delayed data by the falling edge detection unit 280 is illustrated in FIG. 25(c). In this example, the presence of the falling edge is detected at the sixth detection bit.

A diagram of an example of AND[0] to AND[9] generated by the AND gates 261 is illustrated in FIG. 25(d). Since the presence of the falling edge is detected at the sixth bit, and the sixth current bit is "1", AND[6] which is the logical conjunction of them has the value "1". The fact that AND[6] is "1" indicates that the current bit and the delayed bit corresponding to the sixth timing at which the presence of the falling edge is detected have the different values.

A diagram of an example of the determination result generated by the determination result generation unit 262 is illustrated in FIG. 25(e). Since AND[6] is "1", the determination result "1" indicating that the phase change amount is equal to or less than 180 degrees is generated.

A diagram of an example of the arithmetic results Ph[j] provided by the arithmetic circuits 271 is illustrated in FIG. 25(f). In a manner similar to that for the embodiment, the arithmetic results Ph[6] to Ph[8] indicating the values "1" are generated at the sixth to eighth timings.

FIGS. 26(a) to 26(f) are diagrams for explaining an arithmetic method that is applied when the phase change amount exceeds 180 degrees according to the third modification of the embodiment. A diagram of an example of the delayed data Del generated by the delay unit 241 is illustrated in FIG. 26(a). A diagram of an example of the current data Cur generated by the comparison unit 220 is illustrated in FIG. 26(b).

A diagram of an example of the detection result Det of the falling edge detected from the delayed data by the falling edge detection unit 280 is illustrated in FIG. 26(c). In this example, the presence of the falling edge is detected at the first detection bit.

A diagram of an example of AND[0] to AND[9] generated by the AND gates 261 is illustrated in FIG. 26(d). Since the presence of the falling edge is detected at the first bit, and the first current bit is "0", AND[1] which is the logical conjunction of them has the value "0". The fact that AND[1] is "0" indicates that the current bit and the delayed bit corresponding to the first timing at which the presence of the falling edge is detected have the same value.

A diagram of an example of the determination result generated by the determination result generation unit 262 is illustrated in FIG. 26(e). Since all the values of AND[j] are "0", the determination result "0" indicating that the phase change amount is greater than 180 degrees is generated.

A diagram of an example of the arithmetic results Ph[j] provided by the arithmetic circuits 271 is illustrated in FIG. 26(f). In a manner similar to that for the embodiment, the arithmetic results Ph[1] to Ph[1] indicating the values "1" are generated at the first to seventh timings.

As described above, according to the third modification, the analog-to-digital converter 200 detects the falling edge from the delayed data. Therefore, the analog-to-digital converter 200 can determine whether the phase change amount is greater than the half cycle from the detection result and the current data.

Note that the above-mentioned embodiment indicates an example for embodying the present technology, and matters in the embodiment and matters specifying the invention in the claims correlate to each other. Similarly, the matters specifying the invention in the claims and matters denoted by the same names in the embodiment of the present technology correlate to each other. However, the present technology is not limited to the embodiment, and can be embodied by performing various types of modifications on the embodiment within a range not departing from the gist of the technology.

The processing procedures explained in the above-mentioned embodiment may be regarded as a method having a series of these procedures, or may be regarded as a program for causing a computer to execute the series of these procedures, or as a recording medium that stores the program. As the recording medium, for example, a compact disc (CD), a MiniDisc (MD), a digital versatile disc (DVD), a memory card, and a Blu-ray (registered trademark) disc or the like can be used.

Note that the effects described in the present description are only examples, and the effects of the present technology are not limited to these effects. Additional effects may also be obtained.

Note that the present technology can also be configured as follows.

(1) An analog-to-digital converter including:

an oscillator that generates an oscillation signal having a cycle that depends on a signal level of an input analog signal;

a current bit generation unit that generates, as a current bit, a bit indicating a value of the oscillation signal at each of a plurality of timings within the cycle;

a delay unit that delays each current bit over a predetermined period and supplies the delayed current bit as a delayed bit;

a determination unit that determines whether a change amount of a phase of the oscillation signal changed within the predetermined period is greater than a half cycle of the cycle; and an output unit that generates and outputs data indicating a period in which respective values of the current bit and the delayed bit form a specific combination when the change amount is not greater than the half cycle, and generates and outputs data indicating a period in which the respective values of the current bit and the delayed bit are the same or form the specific combination when the change amount is greater than the half cycle.

(2) The analog-to-digital converter according to (1), further including an edge detection unit that detects presence or absence of one of a rising edge and a falling edge of the oscillation signal at each of the plurality of timings on the basis of either the current bit or the delayed bit, wherein the determination unit detects whether the change amount is great as compared with the half cycle in accordance with whether the respective values of the current bit and the delayed bit corresponding to the timing at which the presence of one of the edges is detected are the same.

(3) The analog-to-digital converter according to (2), wherein the edge detection unit detects the presence or absence of one of the edges on the basis of the delayed bit.

(4) The analog-to-digital converter according to (3), wherein the edge detection unit detects the presence or absence of the rising edge on the basis of the delayed bit, and the determination unit determines that the change amount is not greater than the half cycle when the current bit corresponding to the timing at which the presence of the rising edge is detected is at a low level, and determines that the change amount is greater than the half cycle when the current bit is at a high level.

(5) The analog-to-digital converter according to (3), wherein the edge detection unit detects the presence or absence of the falling edge on the basis of the delayed bit, and the determination unit determines that the change amount is not greater than the half cycle when the current bit corresponding to the timing at which the presence of the falling edge is detected is at a high level, and determines that the change amount is greater than the half cycle when the current bit is at a low level.

(6) The analog-to-digital converter according to (2), wherein the edge detection unit detects the presence or absence of one of the edges on the basis of the current bit.

(7) The analog-to-digital converter according to (6), wherein the edge detection unit detects the presence or absence of the rising edge on the basis of the current bit, and the determination unit determines that the change amount is not greater than the half cycle when the delayed bit corresponding to the timing at which the presence of the rising edge is detected is at a high level, and determines that the change amount is greater than the half cycle when the delayed bit is at a low level.

(8) The analog-to-digital converter according to (6) wherein the edge detection unit detects the presence or absence of the falling edge on the basis of the current bit, and the determination unit determines that the change amount is not greater than the half cycle when the delayed bit corresponding to the timing at which the presence of the falling edge is detected is at a low level, and determines that the change amount is greater than the half cycle when the delayed bit is at a high level.

(9) The analog-to-digital converter according to any of (1) to (8), wherein the output unit counts the number of the timings at which the current specific combination is formed and generates data of a count value as the data indicating the period when the change amount is not greater than the half cycle, and counts the number of the timings at which the respective values of the current bit and the delayed bit are the same or form the specific combination and generates data of a count value as the data indicating the period when the change amount is greater than the half cycle.

(10) An electronic device including:

an oscillator that generates an oscillation signal having a cycle that depends on a signal level of an input analog signal;

a current bit generation unit that generates, as a current bit, a bit indicating a value of the oscillation signal at each of a plurality of timings within the cycle;

a delay unit that delays each current bit over a predetermined period and supplies the delayed current bit as a delayed bit;

a determination unit that determines whether a change amount of a phase of the oscillation signal changed within the predetermined period is greater than a half cycle of the cycle;

an output unit that generates and outputs data indicating a period in which respective values of the current bit and the delayed bit form a specific combination when the change amount is not greater than the half cycle, and generates and outputs data indicating a period in which the respective values of the current bit and the delayed bit are the same or form the specific combination when the change amount is greater than the half cycle; and a processing unit that processes the data.

(11) A method of controlling an analog-to-digital converter, the method including:

an oscillation step of generating, by an oscillator, an oscillation signal having a cycle that depends on a signal level of an input analog signal;

a current bit generation step of generating, as a current bit by a current bit generation unit, a bit indicating a value of the oscillation signal at each of a plurality of timings within the cycle;

a delay step of delaying, by a delay unit, each current bit over a predetermined period and supplying the delayed current bit as a delayed bit;

a determination step of determining, by a determination unit, whether a change amount of a phase of the oscillation signal changed within the predetermined period is greater than a half cycle of the cycle; and an output step of generating and outputting, by an output unit, data indicating a period in which respective values of the current bit and the delayed bit form a specific combination when the change amount is not greater than the half cycle, and generating and outputting data indicating a period in which the respective values of the current bit and the delayed bit are the same or form the specific combination when the change amount is greater than the half cycle.

REFERENCE SIGNS LIST

100 Electronic device
110 Analog signal supply unit
120 Reference clock supply unit
130 Digital signal processing unit
200 Analog-to-digital converter
210 Voltage control oscillator
211 Voltage-to-current conversion circuit
212, 213, 214, 215 Inverter
220 Comparison unit
221 Comparator
222 Latch circuit
223 Flip-flop
230 Sampling clock generation unit
240 Digital signal generation unit
241 Delay unit
250 Rising edge detection unit
251, 261, 281 AND (logical conjunction) gate
260 Phase change amount determination unit
262 Determination result generation unit
270 Digital signal output unit
271 Arithmetic circuit
272, 273, 274, 275, 276, 277, 278 Adder
280 Falling edge detection unit

The invention claimed is:

1. An analog-to-digital converter comprising:
an oscillator that generates an oscillation signal having a cycle that depends on a signal level of an input analog signal;
a current bit generation unit that generates, as a current bit, a bit indicating a value of the oscillation signal at each of a plurality of timings within the cycle;
a delay unit that delays each current bit over a predetermined period and supplies the delayed current bit as a delayed bit;
a determination unit that determines whether a change amount of a phase of the oscillation signal changed within the predetermined period is greater than a half cycle of the cycle; and
an output unit that generates and outputs data indicating a period in which respective values of the current bit and the delayed bit form a specific combination when the change amount is not greater than the half cycle, and generates and outputs data indicating a period in which the respective values of the current bit and the delayed bit are the same or form the specific combination when the change amount is greater than the half cycle.

2. The analog-to-digital converter according to claim 1, further comprising an edge detection unit that detects presence or absence of one of a rising edge and a falling edge of the oscillation signal at each of the plurality of timings on the basis of either the current bit or the delayed bit, wherein
the determination unit detects whether the change amount is great as compared with the half cycle in accordance with whether the respective values of the current bit and the delayed bit corresponding to the timing at which the presence of one of the edges is detected are the same.

3. The analog-to-digital converter according to claim 2, wherein
the edge detection unit detects the presence or absence of one of the edges on the basis of the delayed bit.

4. The analog-to-digital converter according to claim 3, wherein
the edge detection unit detects the presence or absence of the rising edge on the basis of the delayed bit, and
the determination unit determines that the change amount is not greater than the half cycle when the current bit corresponding to the timing at which the presence of the rising edge is detected is at a low level, and determines that the change amount is greater than the half cycle when the current bit is at a high level.

5. The analog-to-digital converter according to claim 3, wherein
the edge detection unit detects the presence or absence of the falling edge on the basis of the delayed bit, and
the determination unit determines that the change amount is not greater than the half cycle when the current bit corresponding to the timing at which the presence of the falling edge is detected is at a high level, and determines that the change amount is greater than the half cycle when the current bit is at a low level.

6. The analog-to-digital converter according to claim 2, wherein
the edge detection unit detects the presence or absence of one of the edges on the basis of the current bit.

7. The analog-to-digital converter according to claim 6, wherein
the edge detection unit detects the presence or absence of the rising edge on the basis of the current bit, and
the determination unit determines that the change amount is not greater than the half cycle when the delayed bit corresponding to the timing at which the presence of the rising edge is detected is at a high level, and determines that the change amount is greater than the half cycle when the delayed bit is at a low level.

8. The analog-to-digital converter according to claim 6, wherein
the edge detection unit detects the presence or absence of the falling edge on the basis of the current bit, and
the determination unit determines that the change amount is not greater than the half cycle when the delayed bit corresponding to the timing at which the presence of the falling edge is detected is at a low level, and determines that the change amount is greater than the half cycle when the delayed bit is at a high level.

9. The analog-to-digital converter according to claim 1, wherein
the output unit counts the number of the timings at which the current specific combination is formed and generates data of a count value as the data indicating the period when the change amount is not greater than the half cycle, and counts the number of the timings at which the respective values of the current bit and the delayed bit are the same or form the specific combination and generates data of a count value as the data indicating the period when the change amount is greater than the half cycle.

10. An electronic device comprising:
- an oscillator that generates an oscillation signal having a cycle that depends on a signal level of an input analog signal;
- a current bit generation unit that generates, as a current bit, a bit indicating a value of the oscillation signal at each of a plurality of timings within the cycle;
- a delay unit that delays each current bit over a predetermined period and supplies the delayed current bit as a delayed bit;
- a determination unit that determines whether a change amount of a phase of the oscillation signal changed within the predetermined period is greater than a half cycle of the cycle;
- an output unit that generates and outputs data indicating a period in which respective values of the current bit and the delayed bit form a specific combination when the change amount is not greater than the half cycle, and generates and outputs data indicating a period in which the respective values of the current bit and the delayed bit are the same or form the specific combination when the change amount is greater than the half cycle; and
- a processing unit that processes the data.

11. A method of controlling an analog-to-digital converter, the method comprising:
- an oscillation step of generating, by an oscillator, an oscillation signal having a cycle that depends on a signal level of an input analog signal;
- a current bit generation step of generating, as a current bit by a current bit generation unit, a bit indicating a value of the oscillation signal at each of a plurality of timings within the cycle;
- a delay step of delaying, by a delay unit, each current bit over a predetermined period and supplying the delayed current bit as a delayed bit;
- a determination step of determining, by a determination unit, whether a change amount of a phase of the oscillation signal changed within the predetermined period is greater than a half cycle of the cycle; and
- an output step of generating and outputting, by an output unit, data indicating a period in which respective values of the current bit and the delayed bit form a specific combination when the change amount is not greater than the half cycle, and generating and outputting data indicating a period in which the respective values of the current bit and the delayed bit are the same or form the specific combination when the change amount is greater than the half cycle.

* * * * *